United States Patent
Melnik et al.

(10) Patent No.: US 11,384,648 B2
(45) Date of Patent: *Jul. 12, 2022

(54) METHODS FOR DEPOSITING COATINGS ON AEROSPACE COMPONENTS

(71) Applicant: Applied Materials, Inc., Santa Clara, CA (US)

(72) Inventors: Yuriy Melnik, San Jose, CA (US); Sukti Chatterjee, San Jose, CA (US); Kaushal Gangakhedkar, San Jose, CA (US); Jonathan Frankel, Los Gatos, CA (US); Lance A. Scudder, Sunnyvale, CA (US); Pravin K. Narwankar, Sunnyvale, CA (US); David Alexander Britz, San Jose, CA (US); Thomas Knisley, Livonia, MI (US); Mark Saly, Santa Clara, CA (US); David Thompson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 328 days.

This patent is subject to a terminal disclaimer.

(21) Appl. No.: 16/843,358

(22) Filed: Apr. 8, 2020

(65) Prior Publication Data

US 2020/0240018 A1    Jul. 30, 2020

Related U.S. Application Data

(63) Continuation of application No. 16/356,688, filed on Mar. 18, 2019, now Pat. No. 10,633,740.
(Continued)

(51) Int. Cl.
   *F01D 5/28* (2006.01)
   *F01D 9/02* (2006.01)
   (Continued)

(52) U.S. Cl.
   CPC .............. *F01D 5/288* (2013.01); *C23C 16/30* (2013.01); *C23C 16/34* (2013.01); *C23C 16/405* (2013.01);
   (Continued)

(58) Field of Classification Search
   CPC . F01D 5/288; F01D 5/286; F01D 9/02; F01D 25/12
   See application file for complete search history.

(56) References Cited

U.S. PATENT DOCUMENTS

| 4,698,130 A | 10/1987 | Restall et al. |
| 5,217,757 A | 6/1993 | Olson et al. |

(Continued)

FOREIGN PATENT DOCUMENTS

| CN | 101302610 A | 11/2008 |
| CN | 104647828 A | 5/2015 |

(Continued)

OTHER PUBLICATIONS

Dyer et al. "CVD Tungsten Carbide and Titanium Carbide Coatings for Aerospace Components," SAE Transactions, vol. 98, Section 1: Journal of Aerospace (1989), pp. 64-70. Abstract Only.
(Continued)

*Primary Examiner* — Igor Kershteyn
*Assistant Examiner* — Brian Christopher Delrue
(74) *Attorney, Agent, or Firm* — Patterson + Sheridan, LLP

(57) ABSTRACT

Protective coatings on an aerospace component are provided. An aerospace component includes a surface containing nickel, nickel superalloy, aluminum, chromium, iron, titanium, hafnium, alloys thereof, or any combination thereof, and a coating disposed on the surface, where the coating contains a nanolaminate film stack having two or more pairs of a first deposited layer and a second deposited
(Continued)

layer. The first deposited layer contains chromium oxide, chromium nitride, aluminum oxide, aluminum nitride, or any combination thereof, the second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof, and the first deposited layer and the second deposited layer have different compositions from each other.

20 Claims, 3 Drawing Sheets

Related U.S. Application Data

(60) Provisional application No. 62/767,420, filed on Nov. 14, 2018, provisional application No. 62/644,608, filed on Mar. 19, 2018, provisional application No. 62/644,645, filed on Mar. 19, 2018.

(51) Int. Cl.

| | | |
|---|---|---|
| *C23C 16/455* | (2006.01) | |
| *C23C 16/34* | (2006.01) | |
| *C23C 16/40* | (2006.01) | |
| *C23C 16/30* | (2006.01) | |
| *C23C 16/56* | (2006.01) | |
| *F01D 25/12* | (2006.01) | |
| *F01D 25/28* | (2006.01) | |
| *F23R 3/28* | (2006.01) | |
| *C07F 11/00* | (2006.01) | |
| *F01D 25/14* | (2006.01) | |

(52) U.S. Cl.
CPC .. *C23C 16/45529* (2013.01); *C23C 16/45553* (2013.01); *C23C 16/45555* (2013.01); *C23C 16/56* (2013.01); *F01D 5/286* (2013.01); *F01D 9/02* (2013.01); *F01D 25/12* (2013.01); *F01D 25/28* (2013.01); *F23R 3/28* (2013.01); *C07F 11/005* (2013.01); *F01D 25/145* (2013.01); *F05D 2230/314* (2013.01)

(56) References Cited

U.S. PATENT DOCUMENTS

| | | | |
|---|---|---|---|
| 5,362,228 | A | 11/1994 | Vaudel |
| 5,503,874 | A | 4/1996 | Ackerman et al. |
| 5,912,069 | A * | 6/1999 | Yializis .......... B32B 15/08 428/411.1 |
| 5,950,925 | A | 9/1999 | Fukunaga et al. |
| 6,042,898 | A | 3/2000 | Burns et al. |
| 6,156,382 | A | 12/2000 | Rajagopalan et al. |
| 6,162,715 | A | 12/2000 | Mak et al. |
| 6,207,295 | B1 | 3/2001 | Stowell et al. |
| 6,245,192 | B1 | 6/2001 | Dhindsa et al. |
| 6,309,713 | B1 | 10/2001 | Mak et al. |
| 6,332,926 | B1 | 12/2001 | Pfaendtner et al. |
| 6,359,089 | B2 | 3/2002 | Hung et al. |
| 6,379,466 | B1 | 4/2002 | Sahin et al. |
| 6,402,898 | B1 | 6/2002 | Brumer et al. |
| 6,437,066 | B1 | 8/2002 | Hung et al. |
| 6,465,040 | B2 | 10/2002 | Gupta et al. |
| 6,495,271 | B1 | 12/2002 | Vakil |
| 6,551,929 | B1 | 4/2003 | Kori et al. |
| 6,607,976 | B2 | 8/2003 | Chen et al. |
| 6,620,670 | B2 | 9/2003 | Song et al. |
| 6,620,723 | B1 | 9/2003 | Byun et al. |
| 6,620,956 | B2 | 9/2003 | Chen et al. |
| 6,630,244 | B1 | 10/2003 | Mao et al. |
| 6,677,247 | B2 | 1/2004 | Yuan et al. |
| 6,740,585 | B2 | 5/2004 | Yoon et al. |
| 6,784,096 | B2 | 8/2004 | Chen et al. |
| 6,797,340 | B2 | 9/2004 | Fang et al. |
| 6,800,376 | B1 | 10/2004 | Gupta et al. |
| 6,805,750 | B1 | 10/2004 | Ristau et al. |
| 6,809,026 | B2 | 10/2004 | Yoon et al. |
| 6,811,814 | B2 | 11/2004 | Chen et al. |
| 6,821,891 | B2 | 11/2004 | Chen et al. |
| 6,825,134 | B2 | 11/2004 | Law et al. |
| 6,827,978 | B2 | 12/2004 | Yoon et al. |
| 6,831,021 | B2 | 12/2004 | Chua et al. |
| 6,833,161 | B2 | 12/2004 | Wang et al. |
| 6,838,125 | B2 | 1/2005 | Chung et al. |
| 6,846,516 | B2 | 1/2005 | Yang et al. |
| 6,869,838 | B2 | 3/2005 | Law et al. |
| 6,872,429 | B1 | 3/2005 | Chen et al. |
| 6,905,939 | B2 | 6/2005 | Yuan et al. |
| 6,911,391 | B2 | 6/2005 | Yang et al. |
| 6,924,191 | B2 | 8/2005 | Liu et al. |
| 6,936,538 | B2 | 8/2005 | Byun |
| 6,939,801 | B2 | 9/2005 | Chung et al. |
| 6,939,804 | B2 | 9/2005 | Lai et al. |
| 6,949,342 | B2 | 9/2005 | Golub et al. |
| 6,951,804 | B2 | 10/2005 | Seutter et al. |
| 6,972,267 | B2 | 12/2005 | Cao et al. |
| 7,011,947 | B2 | 3/2006 | Golub et al. |
| 7,026,238 | B2 | 4/2006 | Xi et al. |
| 7,041,335 | B2 | 5/2006 | Chung |
| 7,049,226 | B2 | 5/2006 | Chung et al. |
| 7,081,271 | B2 | 7/2006 | Chung et al. |
| 7,101,795 | B1 | 9/2006 | Xi et al. |
| 7,211,144 | B2 | 5/2007 | Lu et al. |
| 7,211,508 | B2 | 5/2007 | Chung et al. |
| 7,241,686 | B2 | 7/2007 | Marcadal et al. |
| 7,244,683 | B2 | 7/2007 | Chung et al. |
| 7,262,133 | B2 | 8/2007 | Chen et al. |
| 7,264,846 | B2 | 9/2007 | Chang et al. |
| 7,265,048 | B2 | 9/2007 | Chung et al. |
| 7,279,432 | B2 | 10/2007 | Xi et al. |
| 7,285,312 | B2 | 10/2007 | Li |
| 7,317,229 | B2 | 1/2008 | Hung et al. |
| 7,371,467 | B2 | 5/2008 | Han et al. |
| 7,374,825 | B2 | 5/2008 | Hazel et al. |
| 7,396,565 | B2 | 7/2008 | Yang et al. |
| 7,404,985 | B2 | 7/2008 | Chang et al. |
| 7,405,158 | B2 | 7/2008 | Lai et al. |
| 7,416,979 | B2 | 8/2008 | Yoon et al. |
| 7,429,402 | B2 | 9/2008 | Gandikota et al. |
| 7,429,540 | B2 | 9/2008 | Olsen |
| 7,439,191 | B2 | 10/2008 | Law et al. |
| 7,473,655 | B2 | 1/2009 | Wang et al. |
| 7,501,248 | B2 | 3/2009 | Golub et al. |
| 7,507,660 | B2 | 3/2009 | Chen et al. |
| 7,531,468 | B2 | 5/2009 | Metzner et al. |
| 7,547,952 | B2 | 6/2009 | Metzner et al. |
| 7,569,501 | B2 | 8/2009 | Metzner et al. |
| 7,573,586 | B1 | 8/2009 | Boyer et al. |
| 7,585,762 | B2 | 9/2009 | Shah et al. |
| 7,595,263 | B2 | 9/2009 | Chung et al. |
| 7,601,652 | B2 | 10/2009 | Singh et al. |
| 7,651,955 | B2 | 1/2010 | Ranish et al. |
| 7,732,327 | B2 | 6/2010 | Lee et al. |
| 7,737,028 | B2 | 6/2010 | Wang et al. |
| 7,740,960 | B1 | 6/2010 | Zhu et al. |
| 7,776,395 | B2 | 8/2010 | Mahajani |
| 7,816,200 | B2 | 10/2010 | Kher |
| 7,824,743 | B2 | 11/2010 | Lee et al. |
| 7,833,358 | B2 | 11/2010 | Chu et al. |
| 7,846,840 | B2 | 12/2010 | Kori et al. |
| 7,867,900 | B2 | 1/2011 | Lee et al. |
| 7,875,119 | B2 | 1/2011 | Gartland et al. |
| 7,910,165 | B2 | 3/2011 | Ganguli et al. |
| 7,910,231 | B2 | 3/2011 | Schuh et al. |
| 7,910,446 | B2 | 3/2011 | Ma et al. |
| 7,964,505 | B2 | 6/2011 | Khandelwal et al. |
| 7,972,978 | B2 | 7/2011 | Mahajani |
| 8,043,907 | B2 | 10/2011 | Ma et al. |
| 8,056,652 | B2 | 11/2011 | Lockwood et al. |
| 8,114,852 | B2 | 2/2012 | Borca et al. |

(56) References Cited

U.S. PATENT DOCUMENTS

| | | |
|---|---|---|
| 8,192,941 B2 | 6/2012 | Kuersten |
| 8,227,078 B2 | 7/2012 | Morra et al. |
| 8,277,670 B2 | 10/2012 | Heo et al. |
| 8,426,575 B2 | 4/2013 | Borca et al. |
| 8,470,460 B2 | 6/2013 | Lee |
| 8,721,812 B2 | 5/2014 | Furrer et al. |
| 8,741,420 B2 | 6/2014 | Bunker et al. |
| 8,871,297 B2 | 10/2014 | Barnett et al. |
| 8,932,816 B2 | 1/2015 | Kuersten |
| 9,255,327 B2 | 2/2016 | Winter et al. |
| 9,347,145 B2 | 5/2016 | Bessho |
| 9,416,406 B2 | 8/2016 | Kuersten |
| 9,624,534 B2 | 4/2017 | Kuersten |
| 9,683,281 B2 | 6/2017 | Meehan et al. |
| 9,777,583 B2 | 10/2017 | Leggett |
| 9,873,940 B2 | 1/2018 | Xu et al. |
| 10,072,335 B2 | 9/2018 | Marquardt et al. |
| 10,233,760 B2 | 3/2019 | Lee |
| 10,287,899 B2 | 5/2019 | Dierberger |
| 10,369,593 B2 | 8/2019 | Barnett et al. |
| 10,443,142 B2 | 10/2019 | Miettinen et al. |
| 10,488,332 B2 | 11/2019 | Kessler et al. |
| 10,633,740 B2 | 4/2020 | Melnik et al. |
| 11,028,480 B2 | 6/2021 | Knisley et al. |
| 2002/0002258 A1 | 1/2002 | Hung et al. |
| 2002/0045782 A1 | 4/2002 | Hung et al. |
| 2002/0117399 A1 | 8/2002 | Chen et al. |
| 2002/0127336 A1 | 9/2002 | Chen et al. |
| 2002/0136824 A1 | 9/2002 | Gupta et al. |
| 2003/0010451 A1 | 1/2003 | Tzu et al. |
| 2003/0057526 A1 | 3/2003 | Chung et al. |
| 2003/0059535 A1 | 3/2003 | Luo et al. |
| 2003/0059538 A1 | 3/2003 | Chung et al. |
| 2003/0072884 A1 | 4/2003 | Zhang et al. |
| 2003/0082301 A1 | 5/2003 | Chen et al. |
| 2003/0123216 A1 | 7/2003 | Yoon et al. |
| 2003/0124262 A1 | 7/2003 | Chen et al. |
| 2003/0132319 A1 | 7/2003 | Hytros et al. |
| 2003/0134300 A1 | 7/2003 | Golub et al. |
| 2003/0136520 A1 | 7/2003 | Yudovsky et al. |
| 2003/0139005 A1 | 7/2003 | Song et al. |
| 2003/0145875 A1 | 8/2003 | Han et al. |
| 2003/0152980 A1 | 8/2003 | Golub et al. |
| 2003/0157760 A1 | 8/2003 | Xi et al. |
| 2003/0172872 A1 | 9/2003 | Thakur et al. |
| 2003/0198754 A1 | 10/2003 | Xi et al. |
| 2003/0203616 A1 | 10/2003 | Chung et al. |
| 2003/0215570 A1 | 11/2003 | Seutter et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0057832 A1 | 3/2004 | Fleck et al. |
| 2004/0079648 A1 | 4/2004 | Khan et al. |
| 2004/0161628 A1 | 8/2004 | Gupta et al. |
| 2004/0171280 A1 | 9/2004 | Conley et al. |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0053467 A1 | 3/2005 | Ackerman et al. |
| 2005/0085031 A1 | 4/2005 | Lopatin et al. |
| 2005/0126593 A1 | 6/2005 | Budinger et al. |
| 2005/0158590 A1* | 7/2005 | Li .................. C23C 28/325 427/255.19 |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0008838 A1 | 1/2006 | Golub et al. |
| 2006/0019032 A1 | 1/2006 | Wang et al. |
| 2006/0019033 A1 | 1/2006 | Muthukrishnan et al. |
| 2006/0021633 A1 | 2/2006 | Harvey |
| 2006/0024734 A1 | 2/2006 | Golub et al. |
| 2006/0029971 A1 | 2/2006 | Golub et al. |
| 2006/0040052 A1 | 2/2006 | Fang et al. |
| 2006/0057630 A1 | 3/2006 | Golub et al. |
| 2006/0062917 A1 | 3/2006 | Muthukrishnan et al. |
| 2006/0084283 A1 | 4/2006 | Paranjpe et al. |
| 2006/0115659 A1 | 6/2006 | Hazel et al. |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0023142 A1 | 2/2007 | LaGraff et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0160859 A1 | 7/2007 | Darolia et al. |
| 2007/0202254 A1 | 8/2007 | Ganguli et al. |
| 2007/0224411 A1 | 9/2007 | Hazel et al. |
| 2007/0259111 A1 | 11/2007 | Singh et al. |
| 2007/0274837 A1 | 11/2007 | Taylor et al. |
| 2008/0032510 A1 | 2/2008 | Olsen |
| 2008/0038578 A1 | 2/2008 | Li |
| 2008/0056905 A1 | 3/2008 | Golecki |
| 2008/0090425 A9 | 4/2008 | Olsen |
| 2008/0113095 A1 | 5/2008 | Gorman et al. |
| 2008/0135914 A1 | 6/2008 | Krishna et al. |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0155976 A1 | 6/2009 | Ahn et al. |
| 2009/0181051 A1 | 7/2009 | Borca et al. |
| 2009/0186237 A1 | 7/2009 | Lee |
| 2009/0239061 A1 | 9/2009 | Hazel et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1 | 10/2010 | Furrer et al. |
| 2010/0270609 A1 | 10/2010 | Olsen et al. |
| 2010/0279018 A1 | 11/2010 | Hazel et al. |
| 2010/0279305 A1 | 11/2010 | Kuersten |
| 2011/0017997 A1* | 1/2011 | Kamath ............ H01L 27/1218 257/E29.292 |
| 2011/0175038 A1 | 7/2011 | Hou et al. |
| 2011/0293825 A1 | 12/2011 | Atwal et al. |
| 2012/0014992 A1 | 1/2012 | Borca et al. |
| 2012/0024403 A1 | 2/2012 | Gage et al. |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0295794 A1 | 11/2012 | Kuersten |
| 2012/0318773 A1 | 12/2012 | Wu et al. |
| 2013/0048605 A1 | 2/2013 | Sapre et al. |
| 2013/0164456 A1 | 6/2013 | Winter et al. |
| 2013/0292655 A1 | 11/2013 | Becker et al. |
| 2013/0331275 A1 | 12/2013 | Kuersten |
| 2014/0065438 A1 | 3/2014 | Lee |
| 2014/0103284 A1 | 4/2014 | Hsueh et al. |
| 2014/0264297 A1 | 9/2014 | Kumar et al. |
| 2014/0271220 A1 | 9/2014 | Leggett |
| 2015/0017324 A1 | 1/2015 | Barnett et al. |
| 2015/0099268 A1 | 4/2015 | Kuersten |
| 2015/0184296 A1 | 7/2015 | Xu et al. |
| 2015/0221541 A1 | 8/2015 | Nemani et al. |
| 2016/0010472 A1 | 1/2016 | Murphy et al. |

(56) References Cited

U.S. PATENT DOCUMENTS

| | | |
|---|---|---|
| 2016/0060758 A1 | 3/2016 | Marquardt et al. |
| 2016/0181627 A1 | 6/2016 | Roeder et al. |
| 2016/0251972 A1 | 9/2016 | Dierberger |
| 2016/0281230 A1 | 9/2016 | Varadarajan et al. |
| 2016/0298222 A1 | 10/2016 | Meehan et al. |
| 2016/0300709 A1 | 10/2016 | Posseme et al. |
| 2016/0312277 A1 | 10/2016 | Kuersten |
| 2016/0328635 A1 | 11/2016 | Dave et al. |
| 2016/0333493 A1 | 11/2016 | Miettinen et al. |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0158978 A1 | 6/2017 | Montagne et al. |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1 | 11/2017 | Fenwick et al. |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0153880 A1 | 5/2019 | Lee |
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |
| 2019/0284693 A1 | 9/2019 | Task |
| 2019/0284694 A1 | 9/2019 | Knisley et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0330746 A1 | 10/2019 | Britz et al. |
| 2019/0382879 A1 | 12/2019 | Jindal et al. |
| 2020/0027767 A1 | 1/2020 | Zang et al. |
| 2020/0043722 A1 | 2/2020 | Cheng et al. |
| 2020/0240018 A1 | 7/2020 | Melnik et al. |
| 2020/0340107 A1 | 10/2020 | Chatterjee et al. |
| 2020/0361124 A1 | 11/2020 | Britz |
| 2020/0392626 A1 | 12/2020 | Chatterjee et al. |
| 2021/0292901 A1 | 9/2021 | Knisley et al. |

FOREIGN PATENT DOCUMENTS

| | | |
|---|---|---|
| CN | 107313027 A | 11/2017 |
| EP | 0209307 A1 | 1/1987 |
| EP | 0387113 B1 | 12/1993 |
| EP | 1431372 A2 | 6/2004 |
| EP | 1236812 B1 | 5/2006 |
| EP | 2022868 | 2/2009 |
| EP | 2022868 A2 | 2/2009 |
| EP | 2103707 A1 | 9/2009 |
| EP | 2194164 A1 | 6/2010 |
| EP | 2392895 A1 | 12/2011 |
| EP | 2161352 B1 | 2/2014 |
| EP | 3540092 A1 | 9/2019 |
| JP | 2823086 B2 | 11/1998 |
| JP | 2001342556 A | 12/2001 |
| JP | 2003013745 A | 1/2003 |
| JP | 2003164819 A | 6/2003 |
| JP | 2006010403 A | 1/2006 |
| JP | 2006199988 A | 8/2006 |
| JP | 2007182631 A | 7/2007 |
| KR | 20060106104 A | 10/2006 |
| KR | 20110014989 A | 2/2011 |
| KR | 101192248 B1 | 10/2012 |
| KR | 20170063149 A | 6/2017 |
| KR | 101761736 B1 | 7/2017 |
| KR | 20170140354 A | 12/2017 |
| RU | 2630733 | 4/2017 |
| TW | 201812075 A | 4/2018 |
| WO | 9631687 A1 | 10/1996 |
| WO | 00/09778 A1 | 2/2000 |
| WO | 2005059200 A1 | 6/2005 |
| WO | 2014159267 A1 | 10/2014 |
| WO | 2015047783 | 4/2015 |
| WO | 2015047783 A1 | 4/2015 |
| WO | 2019182967 A1 | 9/2019 |

OTHER PUBLICATIONS

Bensch et al. "Modeling of the Influence of Oxidation of Thin-Walled Specimens of Single Crystal Superalloys," Superalloys 2012: 12th International Symposium on Superalloys, The Minerals, Metals & Materials Society, pp. 331-340, <https://www.tms.org/superalloys/10.7449/2012/Superalloys_2012_331_340.pdf>.

Fujita et al. "Sintering of Al2O3—Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.

Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.

Vargas Garcia et al. "Thermal barrier coatings produced by chemical vapor deposition," Science and Technology of Advanced Materials, vol. 4, No. 4, 2003, pp. 397-402.

Heidary et al. "Study on the behavior of atomic layer deposition coatings on a nickel substrate at high temperature," Nanotechnology, 27, 245701, 2016, pp. 1-32.

Kaloyeros et al. "Review-Silicon Nitrtide and Silicon Nitride-Rich Thin Film Technologies: Trends in Deposition Technniques and Related Application". ECS Journal of Solid State Science and Technology, 6 (10) p. 691-p. 714 (2017).

He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.

International Search Report and Written Opinion for International Application No. PCT/US2019/022709 dated Jun. 28, 2019, 13 pages.

International Search Report and Written Opinion dated Jul. 6, 2020 for Application No. PCT/US2020/024285.

Taiwan Office Action dated May 10, 2021 for Application No. 109126499.

European Search Report dated Jul. 26, 2021 for Application No. 19793402.9.

International Search Report and Written Opinion dated Sep. 28, 2021 for Application No. PCT/US2021/035874.

Extended European Search Report dated Oct. 4, 2021 for Application No. 19793402.9.

Taiwan Office Action dated Oct. 7, 2021 for Application No. 109126499.

International Search Report dated Dec. 1, 2021 for Application No. PCT/US2021/046245.

International Search Report and Written Opinion dated Dec. 2, 2021 for Application No. PCT/US2021/045766.

Wang et al., "Hydrogen permeation properties of CrxCy@Cr2O3/Al2O3 composite coating derived from selective oxidation of a Cr—C alloy and atomic layer deposition", International Journal of Hydrogen Energy, 43 (2018) pp. 21133-21141.

Liu et al., "Microstructural evolution of the interface between NiCrAlY coating and superalloy during isothermal oxidation", Materials and Design, 80 (2015) pp. 63-69.

Taiwan Office Action dated Dec. 21, 2020 for Application No. 109113600.

(56) References Cited

OTHER PUBLICATIONS

International Search Report and Written Opinion dated Feb. 2, 2021 for Application No. PCT/US2020/056618.
International Search Report and Written Opinion dated Oct. 30, 2020 for Application No. PCT/US2020/041382.
Growth mechanism of Cr2O3 scales: oxygen diffusion and chromium, oxidation kinetics and effect of yttrium, Materials Science and Engineering A212 (1996) 6-13.
The Role of Active Elements in the Oxidation Behaviour of HighTemperature Metals and Alloys, E. Lang, Dec. 6, 2012 (pp. 111-129 and 153).
Volatility and High Thermal Stability in Mid to Late First Row Transition Metal Diazadienyl Complexes; Organometallics 2011, 30, 5010-5017.
A Review on Alumina-Chrome (Al2O3—Cr2O3) and Chrome-Silica (Cr2O3—SiO2) Refractories Along With Their Binary Phase Diagrams; http://www.idc-online.com/technical_references/pdfs/chemical_engineering/A_Review_on_Alumina_Chrome.pdf.
Oxidation and Hot Corrosion of Superalloys; http://www.tms.org/superalloys/10.7449/1984/Superalloys_1984_651_687.pdf.
International Search Report and Written Opinion dated Jul. 2, 2019 for Application No. PCT/US2019/022788.
International Search Report and Writtne Opinion dated Jul. 2, 2019 for Application No. PCT/US2019/022737.
Growth mechanism of Cr203 scales: oxygen diffusion and chromium, oxidation kinetics and effect of yttrium, Materials Science and Engineering A212 (1996) 6-13.
A Review on Alumina-Chrome (Al203—Cr203) and Chrome-Silica (Cr203—Si02) Refractories Along With Their Binary Phase Diagrams; http://www.idc-online.com/technical_references/pdfs/chemical_engineering/A_Review_on_Alumina_Chrome.pdf.
Tsai, S.C. et al., "Growth mechanism of Cr2O3 scales: oxygen and chromium diffusion, oxidation kinetics and effect of yttrium", Elsevier, 1996, pp. 6-13.
Lang, E., "The Role of Active Elements in the Oxidation Behaviour of High Temperature Metals and Alloys" Elsevier, 1989, pp. 111-129 and 153.
Knisley, Thomas J. et al., "Volatility and High Thermal Stability in Mid- to Late-First-Row Transition-Metal Diazadienyl Complexes", American Chemical Society Publications, Aug. 25, 2011, pp. 5010-5017.
"A Review on Alumina-Chrome (Al2O3—Cr2O3) and Chrome-Silica (Cr2O3—SiO2) Refractories Along With Their Binary Phase Diagrams", 2009, http://www.idc-online.com/technical_references/pdfs/chemical_engineering/A_Review_on_Alumina_Chrome.pdf (Last visited date: May 2019).
Pettit, F.S. et al., "Oxidation and Hot Corrosion of Superalloys", TMS Publications, 1984, pp. 651-687.
International Search Report and Written Report dated Jul. 31, 2020 for Application No. PCT/US2020/027247.
W. Auwarter, "Hexagonal boron nitride monolayers on metal supports: Versatile templates for atoms, molecules and nanostructures", Surface Science Reports 74 (2019) 1-95.
Calderon, "Boron Nitride Growth and Electronics", Cornell University, May 2018.
Liu et al., "Ultrathin high-temperature oxidation-resistant coatings of hexagonal boron nitride" Nature Communications; doi: 10.1038/ncomms3541; Pub. Oct. 4, 2013, 8 pages.
International Search Report and Written Opinion dated Jun. 24, 2020 for Application No. PCT/US2020/019151.
PCT Notification of Transmittal of the International Search Report and the Written Opinion of the International Searching Authority for International Application No. PCT/US2019/019113; dated Jun. 10, 2019; 11 total pages.
Taiwan Office Action dated Apr. 22, 2020 for Application No. 108106406.
PCT International Search Report and the Written Opinion for International Application No. PCT/US2019/041181; dated Oct. 25, 2019; 15 total pages.
Chinese Office Action dated Mar. 16, 2022 for Application No. 201980020460.1.
International Search Report and the Written Opinion for International Application No. PCT/US2020/028462 dated Jul. 29, 2020, 11 pages.
Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.
Leppaniemi, Jarmo, et al., "Corrosion protection of steel with multilayer coatings: Improving the sealing properties of physical vapor deposition CrN coatings with Al2O3/TiO2atomic layer deposition nanolaminates". Thin Solid Films 627 (2017) pp. 59-68.
Ali, Muhammad Rostom, et al., "Electrodeposition of aluminum-chromium alloys from AI&BPC melt and its corrosion and high temperature oxidation behaviors". Electrochimica Acta, vol. 42. No. 15., pp. 2347-2354, 1997.
Wu, Yanlin, et al., "Atomic Layer Deposition from Dissolved Precursors". Nano Letters 2015, 15, 6379-6385.
Johnson, Andrew L., et al., "Recent developments in molecular precursors for atomic layer deposition". Organomet. Chem., 2019, 42, 1-53.
Extended European Search Report dated Feb. 28, 2022 for Application No. 19771810.9.
Partial Supplementary European Search Report dated Feb. 10, 2022 for Application No. 19770951.2.
International Search Report and Written Opinion dated Feb. 18, 2022 for Application No.
Taiwan Office Action dated Feb. 14, 2022 for Application No. 110136873.

\* cited by examiner

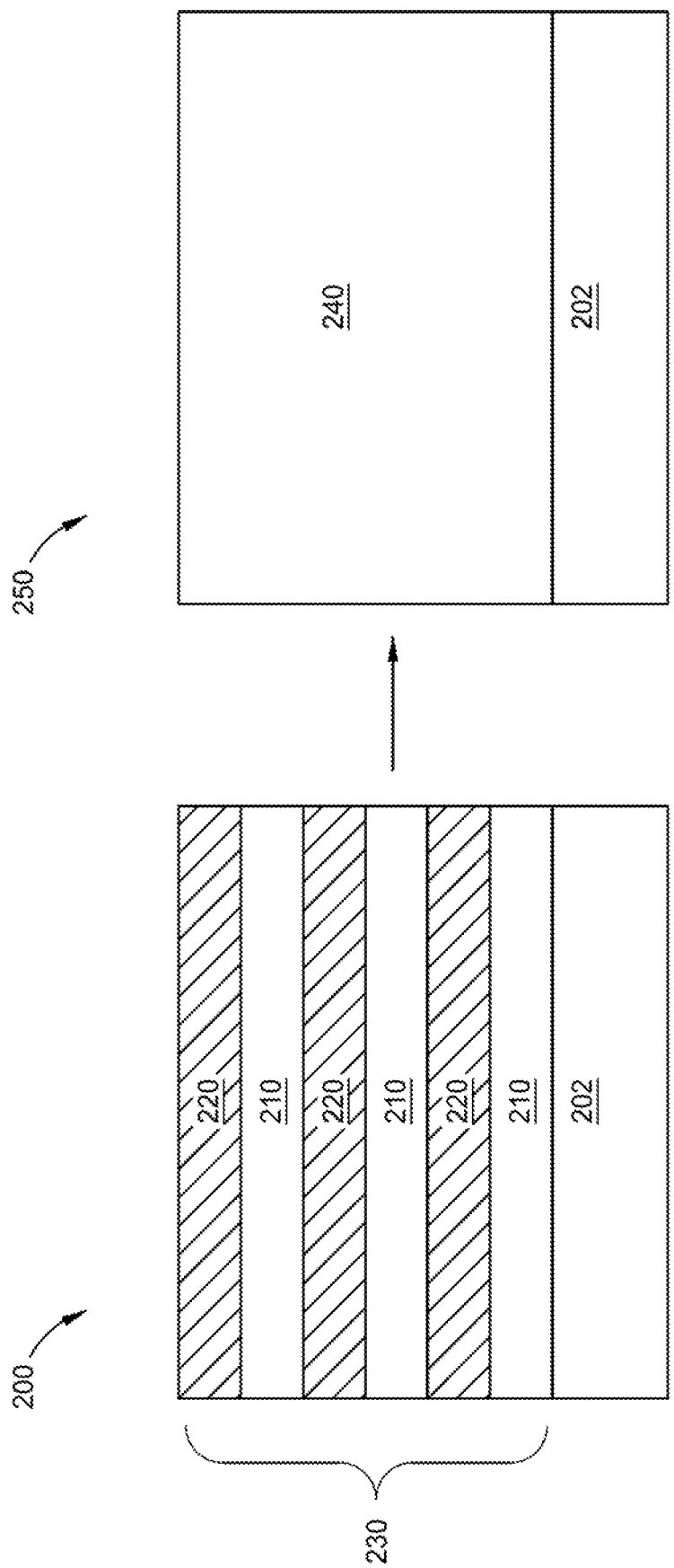

METHODS FOR DEPOSITING COATINGS ON AEROSPACE COMPONENTS

CROSS-REFERENCE TO RELATED APPLICATIONS

This application is a divisional application of U.S. application Ser. No. 16/356,688, filed Mar. 18, 2019, which claims benefit to U.S. Appl. No. 62/767,420, filed on Nov. 14, 2018, U.S. Appl. No. 62/644,608, filed on Mar. 19, 2018, and U.S. Appl. No. 62/644,645, filed on Mar. 19, 2018, which are herein incorporated by reference.

BACKGROUND

Field

Embodiments of the present disclosure generally relate to deposition processes, and in particular to vapor deposition processes for depositing films on aerospace components.

Description of the Related Art

Turbine engines typically have components which corrode or degrade over time due to being exposed to hot gases and/or reactive chemicals (e.g., acids, bases, or salts). Such turbine components are often protected by a thermal and/or chemical barrier coating. The current coatings used on airfoils exposed to the hot gases of combustion in gas turbine engines for both environmental protection and as bond coats in thermal barrier coating (TBC) systems include both diffusion aluminides and various metal alloy coatings. These coatings are applied over substrate materials, typically nickel-based superalloys, to provide protection against oxidation and corrosion attack. These coatings are formed on the substrate in a number of different ways. For example, a nickel aluminide layer may be grown as an outer coat on a nickel base superalloy by simply exposing the substrate to an aluminum rich environment at elevated temperatures. The aluminum diffuses into the substrate and combines with the nickel to form an outer surface of the nickel-aluminum alloy.

A platinum modified nickel aluminide coating can be formed by first electroplating platinum to a predetermined thickness over the nickel-based substrate. Exposure of the platinum-plated substrate to an aluminum-rich environment at elevated temperatures causes the growth of an outer region of the nickel-aluminum alloy containing platinum in solid solution. In the presence of excess aluminum, the platinum-aluminum has two phases that may precipitate in the NiAl matrix as the aluminum diffuses into and reacts with the nickel and platinum.

However, as the increased demands for engine performance elevate the engine operating temperatures and/or the engine life requirements, improvements in the performance of coatings when used as environmental coatings or as bond coatings are needed over and above the capabilities of these existing coatings. Because of these demands, a coating that can be used for environmental protection or as a bond coat capable of withstanding higher operating temperatures or operating for a longer period of time before requiring removal for repair, or both, is desired. These known coating materials and deposition techniques have several shortcomings. Most metal alloy coatings deposited by low pressure plasma spray, plasma vapor deposition (PVD), electron beam PVD (EBPVD), cathodic arc, or similar sputtering techniques are line of sight coatings, meaning that interiors of components are not able to be coated. Platinum electroplating of exteriors typically forms a reasonably uniform coating, however, electroplating the interior of a component has proven to be challenging. The resulting electroplating coatings are often too thin to be protective or too thick that there are other adverse mechanical effects, such as high weight gain or fatigue life debit. Similarly, aluminide coatings suffer from non-uniformity on interior passages of components. Aluminide coatings are brittle, which can lead to reduced life when exposed to fatigue.

In addition, most of these coatings are on the order of greater than 10 micrometers in thickness, which can cause component weight to increase, making design of the disks and other support structures more challenging. Many of these coatings also require high temperature (e.g., greater than 500° C.) steps to deposit or promote enough interdiffusion of the coating into the alloy to achieve adhesion. It is desired by many to have coatings that (1) protect metals from oxidation and corrosion, (2) are capable of high film thickness and composition uniformity on arbitrary geometries, (3) have high adhesion to the metal, (4) are sufficiently thin to not materially increase weight or reduce fatigue life outside of current design practices for bare metal, and/or (5) are deposited at sufficiently low temperature (e.g., 500° C. or less) to not cause microstructural changes to the metal.

Therefore, improved protective coatings and methods for depositing the protective coatings are needed.

SUMMARY

Embodiments of the present disclosure generally relate to protective coatings on aerospace components and methods for depositing the protective coatings. In one or more embodiments, an aerospace component includes a surface comprising nickel, nickel superalloy, aluminum, chromium, iron, titanium, hafnium, alloys thereof, or any combination thereof, and a coating disposed on the surface, where the coating contains a nanolaminate film stack having two or more pairs of a first deposited layer and a second deposited layer. The first deposited layer contains chromium oxide, chromium nitride, aluminum oxide, aluminum nitride, or any combination thereof, and the second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. The first deposited layer and the second deposited layer have different compositions from each other. The nanolaminate film stack has a thickness of about 1 nm to about 5,000 nm.

In some embodiments, an aerospace component includes a surface comprising nickel or nickel superalloy, and a coating disposed on the surface, where the coating contains a coalesced film formed by annealing a nanolaminate film stack which has two or more alternating layers of a first deposited layer and a second deposited layer. The first deposited layer contains chromium oxide, chromium nitride, aluminum oxide, aluminum nitride, or any combination thereof, the second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof, the first deposited layer and the second deposited layer have different compositions from each other.

In other embodiments, a turbine blade includes a surface containing nickel or nickel superalloy, and a coating disposed on the surface, where the coating contain a coalesced film formed by annealing a nanolaminate film stack which contains two or more alternating layers of a first deposited layer and a second deposited layer. The first deposited layer contains chromium oxide, chromium nitride, aluminum oxide, aluminum nitride, or any combination thereof, the second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof, and the first deposited layer and the second deposited layer have different compositions from each other.

In one or more embodiments, a method for depositing a coating on an aerospace component includes exposing an aerospace component to a first precursor and a first reactant to form a first deposited layer on a surface of the aerospace component by a chemical vapor deposition (CVD) process or a first atomic layer deposition (ALD) process and exposing the aerospace component to a second precursor and a second reactant to form a second deposited layer on the first deposited layer by a second ALD process, where the first deposited layer and the second deposited layer have different compositions from each other.

In some embodiments, a method for depositing a coating on an aerospace component includes forming a nanolaminate film stack on a surface of the aerospace component, where the nanolaminate film stack contains alternating layers of a first deposited layer and a second deposited layer. The method includes sequentially exposing the aerospace component to a first precursor and a first reactant to form the first deposited layer on the surface by ALD, where the first deposited layer contains chromium oxide, chromium nitride, aluminum oxide, aluminum nitride, or any combination thereof. The method also includes sequentially exposing the aerospace component to a second precursor and a second reactant to form the second deposited layer on the first deposited layer by ALD, where the second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof, and where the first deposited layer and the second deposited layer have different compositions from each other.

In other embodiments, an aerospace component contains a surface comprising nickel, nickel superalloy, aluminum, chromium, iron, titanium, hafnium, alloys thereof, or any combination thereof and a coating disposed on the surface, where the coating contains a nanolaminate film stack which includes alternating layers of a first deposited layer and a second deposited layer. The first deposited layer contains chromium oxide, chromium nitride, aluminum oxide, aluminum nitride, or any combination thereof. The second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. The first deposited layer and the second deposited layer have different compositions from each other and the nanolaminate film stack has a thickness of about 1 nm to about 5,000 nm, such as about 10 nm to about 800 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 2A and 2B are schematic views of protective coatings disposed on a surface of an aerospace component, according to one or more embodiments described and discussed herein.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to protective coatings, such as nanolaminate film stacks or coalesced films, disposed on an aerospace components and methods for depositing the protective coatings. Aerospace components as described and discussed herein can be or include one or more turbine blades, turbine vanes, ribs, fins, pin fins, combustor fuel nozzles, combustor shields, or any other aerospace component or part that can benefit from having protective coating deposited thereon. The protective coatings can be deposited or otherwise formed on interior surfaces and/or exterior surfaces of the aerospace components.

In one or more embodiments, a method for depositing a protective coating on an aerospace component includes sequentially exposing the aerospace component to a chromium precursor and a reactant to form a chromium-containing layer on a surface the aerospace component by an atomic layer deposition (ALD) process. The chromium-containing layer contains metallic chromium, chromium oxide, chromium nitride, chromium carbide, chromium silicide, or any combination thereof.

In some embodiments, a nanolaminate film stack is formed on the surface of the aerospace component, where the nanolaminate film stack contains alternating layers of the chromium-containing layer and a second deposited layer. The aerospace component can be sequentially exposed to a metal or silicon precursor and a second reactant to form the second deposited layer on the surface by ALD. The second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. The nanolaminate film stack containing the alternating layers of the chromium-containing layer and the second deposited layer can be used as the protective coating on the aerospace component. Alternatively, in other embodiments, the nanolaminate film stack disposed on the aerospace component can be exposed to an annealing process to convert the nanolaminate film stack into a coalesced film, which can be used as the protective coating on the aerospace component.

Figure 1:
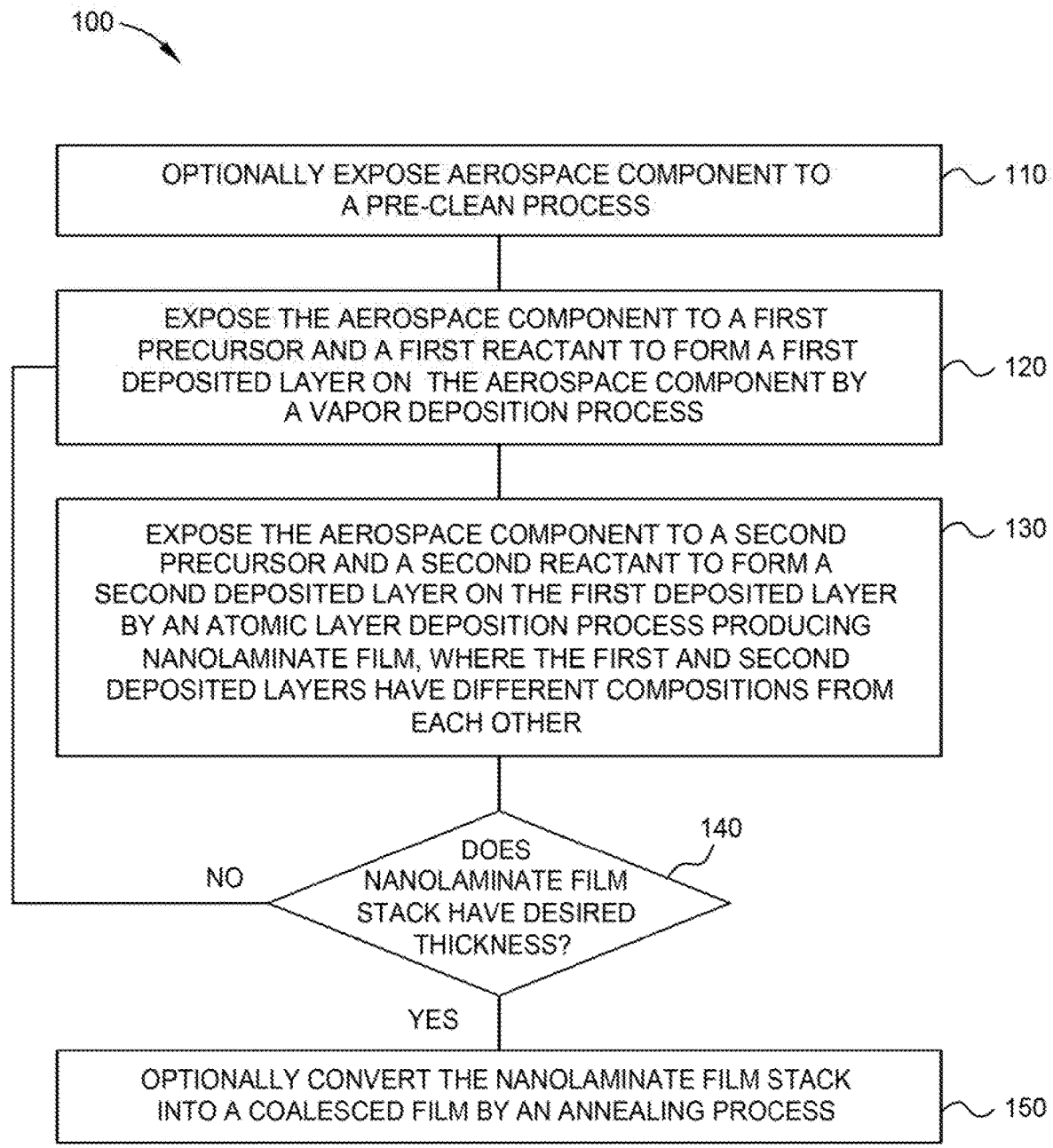
FIG. 1 is a flow chart of a method for depositing a coating on an aerospace component, according to one or more embodiments described and discussed herein.

FIG. 1 is a flow chart of a method 100 for depositing a coating on one or more aerospace components, according to one or more embodiments described and discussed herein. FIGS. 2A and 2B are schematic views of protective coatings 200 and 250 disposed on a surface of the aerospace component 202, according to one or more embodiments described and discussed herein. The protective coatings 200 and 250 can be deposited or otherwise formed on the aerospace component 202 by the method 100 described and discussed below.

In one or more embodiments, the protective coating 200 contains a nanolaminate film stack 230 containing one pair or a plurality of pairs of a first deposited layer 210 and a second deposited layer 220 sequentially deposited or otherwise formed on the aerospace component 202, as depicted in FIG. 2A. The nanolaminate film stack 230 is illustrated with four pairs of the first and second deposited layers 210, 220, however, the nanolaminate film stack 230 can contain any number of the first and second deposited layers 210, 220, as further discussed below. For example, the nanolaminate film stack 230 can contain from one pair of the first and second deposited layers 210, 220 to about 150 pairs of the first and second deposited layers 210, 220. In other embodiments, not shown, the protective coating 200 is not a nanolaminate film stack, but instead contains the first deposited layer 210 or the second deposited layer 220 deposited or otherwise formed on the aerospace component 202. In further embodiments, the nanolaminate film stack 230 containing one or more pairs of the first and second deposited layers 210, 220 is initially deposited, then is converted to a coalesced film 240, such as illustrated by the protective coating 250 depicted in FIG. 2B.

At block 110, prior to producing the protective coating 200 or 250, the aerospace component 202 can optionally be exposed to one or more pre-clean processes. The surfaces of the aerospace component 202 can contain oxides, organics, oil, soil, particulate, debris, and/or other contaminants are removed prior to producing the protective coating 200 or 250 on the aerospace component 202. The pre-clean process can be or include one or more basting or texturing processes, vacuum purges, solvent clean, acid clean, wet clean, plasma clean, sonication, or any combination thereof. Once cleaned and/or textured, the subsequently deposited protective coating 200 or 250 has stronger adhesion to the surfaces of the aerospace component 202 than if otherwise not exposed to the pre-clean process.

In one or more examples, the surfaces of the aerospace component 202 can be blasted with or otherwise exposed to beads, sand, carbonate, or other particulates to remove oxides and other contaminates therefrom and/or to provide texturing to the surfaces of the aerospace component 202. In some examples, the aerospace component 202 can be placed into a chamber within a pulsed push-pull system and exposed to cycles of purge gas (e.g., $N_2$, Ar, He, or any combination thereof) and vacuum purges to remove debris from small holes on the aerospace component 202. In other examples, the surfaces of the aerospace component 202 can be exposed to hydrogen plasma, oxygen or ozone plasma, and/or nitrogen plasma, which can be generated in a plasma chamber or by a remote plasma system.

In one or more examples, such as for organic removal or oxide removal, the surfaces of the aerospace component 202 can be exposed to a hydrogen plasma, then degassed, then exposed to ozone treatment. In other examples, such as for organic removal, the surfaces of the aerospace component 202 can be exposed to a wet clean that includes: soaking in an alkaline degreasing solution, rinsing, exposing the surfaces to an acid clean (e.g., sulfuric acid, phosphoric acid, or hydrochloric acid), rinsing, and exposing the surfaces deionized water sonication bath. In some examples, such as for oxide removal, the surfaces of the aerospace component 202 can be exposed to a wet clean that includes: exposing the surfaces to a dilute acid solution (e.g., acetic acid or hydrochloric acid), rinsing, and exposing the surfaces deionized water sonication bath. In one or more examples, such as for particle removal, the surfaces of the aerospace component 202 can be exposed to sonication (e.g., megasonication) and/or a supercritical carbon dioxide wash, followed by exposing to cycles of purge gas (e.g., $N_2$, Ar, He, or any combination thereof) and vacuum purges to remove particles from and dry the surfaces. In some examples, the aerospace component 202 can be exposed to heating or drying processes, such as heating the aerospace component 202 to a temperature of about 50° C., about 65° C., or about 80° C. to about 100° C., about 120° C., or about 150° C. and exposing to surfaces to the purge gas. The aerospace component 202 can be heated in an oven or exposed to lamps for the heating or drying processes.

At block 120, the aerospace component 202 can be exposed to a first precursor and a first reactant to form the first deposited layer 210 on the aerospace component 202 by a vapor deposition process, as depicted in FIG. 2A. The vapor deposition process can be an ALD process, a plasma-enhanced ALD (PE-ALD) process, a thermal chemical vapor deposition (CVD) process, a plasma-enhanced CVD (PE-CVD) process, or any combination thereof.

In one or more embodiments, the vapor deposition process is an ALD process and the method includes sequentially exposing the surface of the aerospace component 202 to the first precursor and the first reactant to form the first deposited layer 210. Each cycle of the ALD process includes exposing the surface of the aerospace component to the first precursor, conducting a pump-purge, exposing the aerospace component to the first reactant, and conducting a pump-purge to form the first deposited layer 210. The order of the first precursor and the first reactant can be reversed, such that the ALD cycle includes exposing the surface of the aerospace component to the first reactant, conducting a pump-purge, exposing the aerospace component to the first precursor, and conducting a pump-purge to form the first deposited layer 210.

In some examples, during each ALD cycle, the aerospace component 202 is exposed to the first precursor for about 0.1 seconds to about 10 seconds, the first reactant for about 0.1 seconds to about 10 seconds, and the pump-purge for about 0.5 seconds to about 30 seconds. In other examples, during each ALD cycle, the aerospace component 202 is exposed to the first precursor for about 0.5 seconds to about 3 seconds, the first reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the first deposited layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the first deposited layer 210.

In other embodiments, the vapor deposition process is a CVD process and the method includes simultaneously exposing the aerospace component 202 to the first precursor and the first reactant to form the first deposited layer 210. During an ALD process or a CVD process, each of the first precursor and the first reactant can independent include one or more carrier gases. One or more purge gases can be flowed across the aerospace component and/or throughout the processing chamber in between the exposures of the first precursor and the first reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

The first deposited layer 210 can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the first deposited layer 210 can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In one or more embodiments, the first precursor contains one or more chromium precursors, one or more aluminum precursors, or one or more hafnium precursors. The first reactant contains one or more reducing agents, one or more oxidizing agents, one or more nitriding agents, one or more silicon precursors, one or more carbon precursors, or any combination thereof. In some examples, the first deposited layer 210 is a chromium-containing layer which can be or include metallic chromium, chromium oxide, chromium nitride, chromium silicide, chromium carbide, or any combination thereof. In other examples, the first deposited layer 210 is an aluminum-containing layer which can be or include metallic aluminum, aluminum oxide, aluminum nitride, aluminum silicide, aluminum carbide, or any combination thereof. In further examples, the first deposited layer 210 is a hafnium-containing layer which can be or include metallic hafnium, hafnium oxide, hafnium nitride, hafnium silicide, hafnium carbide, or any combination thereof.

The chromium precursor can be or include one or more of chromium cyclopentadiene compounds, chromium carbonyl compounds, chromium acetylacetonate compounds, chromium diazadienyl compounds, substitutes thereof, complexes thereof, abducts thereof, salts thereof, or any combination thereof. Exemplary chromium precursor can be or include bis(cyclopentadiene) chromium ($Cp_2Cr$), bis(pentamethylcyclopentadiene) chromium (($Me_5Cp)_2Cr$), bis(isopropylcyclopentadiene) chromium (($iPrCp)_2Cr$), bis(ethylbenzene) chromium (($EtBz)_2Cr$), chromium hexacarbonyl ($Cr(CO)_6$), chromium acetylacetonate ($Cr(acac)_3$, also known as, tris(2,4 pentanedione) chromium), chromium hexafluoroacetylacetonate ($Cr(hfac)_3$), chromium(III) tris(2,2,6,6-tetramethyl-3,5-heptanedionate) {$Cr(tmhd)_3$}, chromium(II) bis(1,4-ditertbutyldiazadienyl), isomers thereof, complexes thereof, abducts thereof, salts thereof, or any combination thereof. Exemplary chromium diazadienyl compounds can have a chemical formula of:

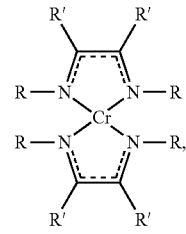

where each R and R' is independently selected from H, C1-C6 alkyl, aryl, acyl, alkylamido, hydrazido, silyl, aldehyde, keto, C2-C4 alkenyl, alkynyl, or substitutes thereof. In some examples, each R is independently a C1-C6 alkyl which is selected from methyl, ethyl, propyl, butyl, or isomers thereof, and R' is H. For example, R is methyl and R' is H, R is ethyl and R' is H, R is iso-propyl and R' is H, or R is tert-butyl and R' is H.

The aluminum precursor can be or include one or more of aluminum alkyl compounds, one or more of aluminum alkoxy compounds, one or more aluminum acetylacetonate compounds, substitutes thereof, complexes thereof, abducts thereof, salts thereof, or any combination thereof. Exemplary aluminum precursors can be or include trimethylaluminum, triethylaluminum, tripropylaluminum, tributylaluminum, trimethoxyaluminum, triethoxyaluminum, tripropoxyaluminum, tributoxyaluminum, aluminum acetylacetonate (Al(acac)$_3$, also known as, tris(2,4 pentanedione) aluminum), aluminum hexafluoroacetylacetonate (Al(hfac)$_3$), trisdipivaloylmethanatoaluminum (DPM$_3$Al; (C$_{11}$H$_{19}$O$_2$)$_3$Al), isomers thereof, complexes thereof, abducts thereof, salts thereof, or any combination thereof.

The hafnium precursor can be or include one or more of hafnium cyclopentadiene compounds, one or more of hafnium amino compounds, one or more of hafnium alkyl compounds, one or more of hafnium alkoxy compounds, substitutes thereof, complexes thereof, abducts thereof, salts thereof, or any combination thereof. Exemplary hafnium precursors can be or include bis(methylcyclopentadiene) dimethylhafnium ((MeCp)$_2$HfMe$_2$), bis(methylcyclopentadiene) methylmethoxyhafnium ((MeCp)$_2$Hf(OMe)(Me)), bis(cyclopentadiene) dimethylhafnium ((Cp)$_2$HfMe$_2$), tetra (tert-butoxy) hafnium, hafnium isopropoxide ((iPrO)$_4$Hf), tetrakis(dimethylamino) hafnium (TDMAH), tetrakis(diethylamino) hafnium (TDEAH), tetrakis(ethylmethylamino) hafnium (TEMAH), isomers thereof, complexes thereof, abducts thereof, salts thereof, or any combination thereof.

The titanium precursor can be or include one or more of titanium cyclopentadiene compounds, one or more of titanium amino compounds, one or more of titanium alkyl compounds, one or more of titanium alkoxy compounds, substitutes thereof, complexes thereof, abducts thereof, salts thereof, or any combination thereof. Exemplary titanium precursors can be or include bis(methylcyclopentadiene) dimethyltitanium ((MeCp)$_2$TiMe$_2$), bis(methylcyclopentadiene) methylmethoxytitanium ((MeCp)$_2$Ti(OMe)(Me)), bis (cyclopentadiene) dimethyltitanium ((Cp)$_2$TiMe$_2$), tetra (tert-butoxy) titanium, titanium isopropoxide ((iPrO)$_4$Ti), tetrakis(dimethylamino) titanium (TDMAT), tetrakis(diethylamino) titanium (TDEAT), tetrakis(ethylmethylamino) titanium (TEMAT), isomers thereof, complexes thereof, abducts thereof, salts thereof, or any combination thereof.

In one or more examples, the first deposited layer 210 is a chromium-containing layer which can be or include metallic chromium and the first reactant contains one or more reducing agents. In some examples, the first deposited layer 210 is an aluminum-containing layer which can be or include metallic aluminum and the first reactant contains one or more reducing agents. In other examples, the first deposited layer 210 is a hafnium-containing layer which can be or include metallic hafnium and the first reactant contains one or more reducing agents. Exemplary reducing agents can be or include hydrogen (H$_2$), ammonia, hydrazine, one or more hydrazine compounds, one or more alcohols, a cyclohexadiene, a dihydropyrazine, an aluminum containing compound, abducts thereof, salts thereof, plasma derivatives thereof, or any combination thereof.

In some examples, the first deposited layer 210 is a chromium-containing layer which can be or include chromium oxide and the first reactant contains one or more oxidizing agents. In other examples, the first deposited layer 210 is an aluminum-containing layer which can be or include aluminum oxide and the first reactant contains one or more oxidizing agents. In further examples, the first deposited layer 210 is a hafnium-containing layer which can be or include hafnium oxide and the first reactant contains one or more oxidizing agents. Exemplary oxidizing agents can be or include water (e.g., steam), oxygen (O$_2$), atomic oxygen, ozone, nitrous oxide, one or more peroxides, one or more alcohols, plasmas thereof, or any combination thereof.

In one or more examples, the first deposited layer 210 is a chromium-containing layer which can be or include chromium nitride and the first reactant contains one or more nitriding agents. In other examples, the first deposited layer 210 is an aluminum-containing layer which can be or include aluminum nitride and the first reactant contains one or more nitriding agents. In some examples, the first deposited layer 210 is a hafnium-containing layer which can be or include hafnium nitride and the first reactant contains one or more nitriding agents. Exemplary nitriding agents can be or include ammonia, atomic nitrogen, one or more hydrazines, nitric oxide, plasmas thereof, or any combination thereof.

In one or more examples, the first deposited layer 210 is a chromium-containing layer which can be or include chromium silicide and the first reactant contains one or more silicon precursors. In some examples, the first deposited layer 210 is an aluminum-containing layer which can be or include aluminum silicide and the first reactant contains one or more silicon precursors. In other examples, the first deposited layer 210 is a hafnium-containing layer which can be or include hafnium silicide and the first reactant contains one or more silicon precursors. Exemplary silicon precursors can be or include silane, disilane, trisilane, tetrasilane, pentasilane, hexasilane, monochlorosilane, dichlorosilane, trichlorosilane, tetrachlorosilane, hexachlorosilane, substituted silanes, plasma derivatives thereof, or any combination thereof.

In some examples, the first deposited layer 210 is a chromium-containing layer which can be or include chromium carbide and the first reactant contains one or more carbon precursors. In other examples, the first deposited layer 210 is an aluminum-containing layer which can be or include aluminum carbide and the first reactant contains one or more carbon precursors. In further examples, the first deposited layer 210 is a hafnium-containing layer which can be or include hafnium carbide and the first reactant contains one or more carbon precursors. Exemplary carbon precursors can be or include one or more alkanes, one or more alkenes, one or more alkynes, substitutes thereof, plasmas thereof, or any combination thereof.

At block 130, the aerospace component 202 is exposed to a second precursor and a second reactant to form the second deposited layer 220 on the first deposited layer 210 by an ALD process producing nanolaminate film. The first deposited layer 210 and second deposited layer 220 have different compositions from each other. In some examples, the first precursor is a different precursor than the second precursor, such as that the first precursor is a source of a first type of metal and the second precursor is a source of a second type of metal and the first and second types of metal are different.

The second precursor can be or include one or more aluminum precursors one or more hafnium precursors, one or more yttrium precursors, or any combination thereof. The second reactant can be any other reactants used as the first reactant. For example, the second reactant can be or include one or more reducing agents, one or more oxidizing agents, one or more nitriding agents, one or more silicon precursors, one or more carbon precursors, or any combination thereof, as described and discussed above. During the ALD process, each of the second precursor and the second reactant can independent include one or more carrier gases. One or more purge gases can be flowed across the aerospace component and/or throughout the processing chamber in between the exposures of the second precursor and the second reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

In one or more embodiments, the second deposited layer 220 contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. In one or more examples, if the first deposited layer 210 contains aluminum oxide or aluminum nitride, then the second deposited layer 220 does not contain aluminum oxide or aluminum nitride. Similarly, if the first deposited layer 210 contains hafnium oxide or hafnium nitride, then the second deposited layer 220 does not contain hafnium oxide or hafnium nitride.

Each cycle of the ALD process includes exposing the aerospace component to the second precursor, conducting a pump-purge, exposing the aerospace component to the second reactant, and conducting a pump-purge to form the second deposited layer 220. The order of the second precursor and the second reactant can be reversed, such that the ALD cycle includes exposing the surface of the aerospace component to the second reactant, conducting a pump-purge, exposing the aerospace component to the second precursor, and conducting a pump-purge to form the second deposited layer 220.

In one or more examples, during each ALD cycle, the aerospace component 202 is exposed to the second precursor for about 0.1 seconds to about 10 seconds, the second reactant for about 0.1 seconds to about 10 seconds, and the pump-purge for about 0.5 seconds to about 30 seconds. In other examples, during each ALD cycle, the aerospace component 202 is exposed to the second precursor for about 0.5 seconds to about 3 seconds, the second reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the second deposited layer 220. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the second deposited layer 220.

The second deposited layer 220 can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the second deposited layer 220 can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In some examples, the first deposited layer 210 is a chromium-containing layer that contains chromium oxide, chromium nitride, or a combination thereof, and the second deposited layer 220 contains one or more of aluminum oxide, silicon nitride, hafnium oxide, hafnium silicate, titanium oxide, or any combination thereof.

At block 140, the method 100 includes deciding whether or not a desired thickness of the nanolaminate film stack 230 has been achieved. If the desired thickness of the nanolaminate film stack 230 has been achieved, then move to block 150. If the desired thickness of the nanolaminate film stack 230 has not been achieved, then start another deposition cycle of depositing the first deposited layer 210 by the vapor deposition process at block 120 and depositing the second deposited layer 220 by the ALD process at block 130. The deposition cycle is repeated until achieving the desired thickness of the nanolaminate film stack 230.

In one or more embodiments, the protective coating 200 or the nanolaminate film stack 230 can contain from 1, 2, 3, 4, 5, 6, 7, 8, or 9 pairs of the first and second deposited layers 210, 220 to about 10, about 12, about 15, about 20, about 25, about 30, about 40, about 50, about 65, about 80, about 100, about 120, about 150, about 200, about 250, about 300, about 500, about 800, or about 1,000 pairs of the first and second deposited layers 210, 220. For example, the nanolaminate film stack 230 can contain from 1 to about 1,000, 1 to about 800, 1 to about 500, 1 to about 300, 1 to about 250, 1 to about 200, 1 to about 150, 1 to about 120, 1 to about 100, 1 to about 80, 1 to about 65, 1 to about 50, 1 to about 30, 1 to about 20, 1 to about 15, 1 to about 10, 1 to about 8, 1 to about 6, 1 to 5, 1 to 4, 1 to 3, about 5 to about 150, about 5 to about 120, about 5 to about 100, about 5 to about 80, about 5 to about 65, about 5 to about 50, about 5 to about 30, about 5 to about 20, about 5 to about 15, about 5 to about 10, about 5 to about 8, about 5 to about 7, about 10 to about 150, about 10 to about 120, about 10 to about 100, about 10 to about 80, about 10 to about 65, about 10 to about 50, about 10 to about 30, about 10 to about 20, about 10 to about 15, or about 10 to about 12 pairs of the first and second deposited layers 210, 220.

The protective coating 200 or the nanolaminate film stack 230 can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 800 nm, about 1,000 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating 200 or the nanolaminate film stack 230 can have a thickness of less than 10 μm (less than 10,000 nm). For example, the protective coating 200 or the nanolaminate film stack 230 can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

At block 150, the nanolaminate film stack 230 can optionally be exposed to one or more annealing processes. In some examples, the nanolaminate film stack 230 can be converted into the coalesced film 240 during the annealing process. During the annealing process, the high temperature coalesces the layers within the nanolaminate film stack 230 into a single structure where the new crystalline assembly enhances the integrity and protective properties of the coalesced film 240. In other examples, the nanolaminate film stack 230 can be heated and densified during the annealing process, but still maintained as a nanolaminate film stack. The annealing process can be or include a thermal anneal, a plasma anneal, an ultraviolet anneal, a laser anneal, or any combination thereof.

The nanolaminate film stack 230 disposed on the aerospace component 202 is heated to a temperature of about 400° C., about 500° C., about 600° C., or about 700° C. to about 750° C., about 800° C., about 900° C., about 1,000° C., about 1,100° C., about 1,200° C., or greater during the annealing process. For example, the nanolaminate film stack 230 disposed on the aerospace component 202 is heated to a temperature of about 400° C. to about 1,200° C., about 400° C. to about 1,100° C., about 400° C. to about 1,000° C., about 400° C. to about 900° C., about 400° C. to about 800° C., about 400° C. to about 700° C., about 400° C. to about 600° C., about 400° C. to about 500° C., about 550° C. to about 1,200° C., about 550° C. to about 1,100° C., about 550° C. to about 1,000° C., about 550° C. to about 900° C., about 550° C. to about 800° C., about 550° C. to about 700° C., about 550° C. to about 600° C., about 700° C. to about 1,200° C., about 700° C. to about 1,100° C., about 700° C. to about 1,000° C., about 700° C. to about 900° C., about 700° C. to about 800° C., about 850° C. to about 1,200° C., about 850° C. to about 1,100° C., about 850° C. to about 1,000° C., or about 850° C. to about 900° C. during the annealing process.

The nanolaminate film stack 230 can be under a vacuum at a low pressure (e.g., from about 0.1 Torr to less than 760 Torr), at ambient pressure (e.g., about 760 Torr), and/or at a high pressure (e.g., from greater than 760 Torr (1 atm) to about 3,678 Torr (about 5 atm)) during the annealing process. The nanolaminate film stack 230 can be exposed to an atmosphere containing one or more gases during the annealing process. Exemplary gases used during the annealing process can be or include nitrogen ($N_2$), argon, helium, hydrogen ($H_2$), oxygen ($O_2$), or any combinations thereof. The annealing process can be performed for about 0.01 seconds to about 10 minutes. In some examples, the annealing process can be a thermal anneal and lasts for about 1 minute, about 5 minutes, about 10 minutes, or about 30 minutes to about 1 hour, about 2 hours, about 5 hours, or about 24 hours. In other examples, the annealing process can be a laser anneal or a spike anneal and lasts for about 1 millisecond, about 100 millisecond, or about 1 second to about 5 seconds, about 10 seconds, or about 15 seconds.

The protective coating 250 or the coalesced film 240 can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 700 nm, about 850 nm, about 1,000 nm, about 1,200 nm, about 1,500 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating 250 or the coalesced film 240 can have a thickness of less than 10 μm (less than 10,000 nm). For example, the protective coating 250 or the coalesced film 240 can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In one or more embodiments, the protective coatings 200 and 250 can have a relatively high degree of uniformity. The protective coatings 200 and 250 can have a uniformity of less than 50%, less than 40%, or less than 30% of the thickness of the respective protective coating 200, 250. The protective coatings 200 and 250 can independently have a uniformity from about 0%, about 0.5%, about 1%, about 2%, about 3%, about 5%, about 8%, or about 10% to about 12%, about 15%, about 18%, about 20%, about 22%, about 25%, about 28%, about 30%, about 35%, about 40%, about 45%, or less than 50% of the thickness. For example, the protective coatings 200 and 250 can independently have a uniformity from about 0% to about 50%, about 0% to about 40%, about 0% to about 30%, about 0% to less than 30%, about 0% to about 28%, about 0% to about 25%, about 0% to about 20%, about 0% to about 15%, about 0% to about 10%, about 0% to about 8%, about 0% to about 5%, about 0% to about 3%, about 0% to about 2%, about 0% to about 1%, about 1% to about 50%, about 1% to about 40%, about 1% to about 30%, about 1% to less than 30%, about 1% to about 28%, about 1% to about 25%, about 1% to about 20%, about 1% to about 15%, about 1% to about 10%, about 1% to about 8%, about 1 to about 5%, about 1% to about 3%, about 1% to about 2%, about 5% to about 50%, about 5% to about 40%, about 5% to about 30%, about 5% to less than 30%, about 5% to about 28%, about 5% to about 25%, about 5% to about 20%, about 5% to about 15%, about 5% to about 10%, about 5% to about 8%, about 10% to about 50%, about 10% to about 40%, about 10% to about 30%, about 10% to less than 30%, about 10% to about 28%, about 10% to about 25%, about 10% to about 20%, about 10% to about 15%, or about 10% to about 12% of the thickness.

In some embodiments, the protective coatings 200 and/or 250 contain can be formed or otherwise produced with different ratios of metals throughout the material, such as a doping metal or grading metal contained within a base metal, where any of the metal can be in any chemically oxidized form (e.g., oxide, nitride, silicide, carbide, or combinations thereof). In one or more examples, the first deposited layer 210 is deposited to first thickness and the second deposited layer 220 is deposited to a second thickness, where the first thickness or less than or greater than the second thickness. For example, the first deposited layer 210 can be deposited by two or more (3, 4, 5, 6, 7, 8, 9, 10, or more) ALD cycles during block 120 to produce the respectively same amount of sub-layers (e.g., one sub-layer for each ALD cycle), and then the second deposited layer 220 can be deposited by one ALD cycle or a number of ALD cycles that is less than or greater than the number of ALD cycles used to deposit the first deposited layer 210. In other examples, the first deposited layer 210 can be deposited by CVD to a first thickness and the second deposited layer 220 is deposited by ALD to a second thickness which is less than the first thickness.

In other embodiments, an ALD process can be used to deposit the first deposited layer 210 and/or the second deposited layer 220 where the deposited material is doped by including a dopant precursor during the ALD process. In some examples, the dopant precursor can be included a separate ALD cycle relative to the ALD cycles used to deposit the base material. In other examples, the dopant precursor can be co-injected with any of the chemical precursors used during the ALD cycle. In further examples, the dopant precursor can be injected separate from the chemical precursors during the ALD cycle. For example, one ALD cycle can include exposing the aerospace component to: the first precursor, a pump-purge, the dopant precursor, a pump-purge, the first reactant, and a pump-purge to form the deposited layer. In some examples, one ALD cycle can include exposing the aerospace component to: the dopant precursor, a pump-purge, the first precursor, a pump-purge, the first reactant, and a pump-purge to form the deposited layer. In other examples, one ALD cycle can include exposing the aerospace component to: the first precursor, the dopant precursor, a pump-purge, the first reactant, and a pump-purge to form the deposited layer.

In one or more embodiments, the first deposited layer 210 and/or the second deposited layer 220 contains one or more base materials and one or more doping materials. The base material is or contains aluminum oxide, chromium oxide, or a combination of aluminum oxide and chromium oxide. The doping material is or contains hafnium, hafnium oxide, yttrium, yttrium oxide, cerium, cerium oxide, silicon, silicon oxide, nitrides thereof, or any combination thereof. Any of the precursors or reagents described herein can be used as a doping precursor or a dopant. Exemplary cerium precursor can be or include one or more cerium(IV) tetra(2,2,6,6-tetramethyl-3,5-heptanedionate) (Ce(TMHD)$_4$), tris(cyclopentadiene) cerium (($C_5H_5)_3$Ce), tris(propylcyclopentadiene) cerium ($[(C_3H_7)C_5H_4]_3$Ce), tris(tetramethylcyclopentadiene) cerium ($[(CH_3)_4C_5H]_3$Ce), or any combination thereof.

The doping material can have a concentration of about 0.01 atomic percent (at %), about 0.05 at %, about 0.08 at %, about 0.1 at %, about 0.5 at %, about 0.8 at %, about 1 at %, about 1.2 at %, about 1.5 at %, about 1.8 at %, or about 2 at % to about 2.5 at %, about 3 at %, about 3.5 at %, about 4 at %, about 5 at %, about 8 at %, about 10 at %, about 15 at %, about 20 at %, about 25 at %, or about 30 at % within the first deposited layer 210, the second deposited layer 220, the nanolaminate film stack 230, and/or the coalesced film 240. For example, the doping material can have a concentration of about 0.01 at % to about 30 at %, about 0.01 at % to about 25 at %, about 0.01 at % to about 20 at %, about 0.01 at % to about 15 at %, about 0.01 at % to about 12 at %, about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.1 at % to about 30 at %, about 0.1 at % to about 25 at %, about 0.1 at % to about 20 at %, about 0.1 at % to about 15 at %, about 0.1 at % to about 12 at %, about 0.1 at % to about 10 at %, about 0.1 at % to about 8 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 1 at % to about 30 at %, about 1 at % to about 25 at %, about 1 at % to about 20 at %, about 1 at % to about 15 at %, about 1 at % to about 12 at %, about 1 at % to about 10 at %, about 1 at % to about 8 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the first deposited layer 210, the second deposited layer 220, the nanolaminate film stack 230, and/or the coalesced film 240.

In one or more embodiments, the protective coating 200 includes the nanolaminate film stack 230 having the first deposited layer 210 containing aluminum oxide (or other base material) and the second deposited layer 220 containing hafnium oxide (or other doping material), or having the first deposited layer 210 containing hafnium oxide (or other doping material) and the second deposited layer 220 containing aluminum oxide (or other base material). In one or more examples, the protective coatings 200 and/or 250 contain a combination of aluminum oxide and hafnium oxide, a hafnium-doped aluminum oxide, hafnium aluminate, or any combination thereof. For example, the protective coating 200 includes the nanolaminate film stack 230 having the first deposited layer 210 contains aluminum oxide and the second deposited layer 220 contains hafnium oxide, or having the first deposited layer 210 contains hafnium oxide and the second deposited layer 220 contains aluminum oxide. In other examples, the protective coating 250 includes the coalesced film 240 formed from layers of aluminum oxide and hafnium oxide. In one or more embodiments, the protective coating 200 or 250 has a concentration of hafnium (or other doping material) of about 0.01 at %, about 0.05 at %, about 0.08 at %, about 0.1 at %, about 0.5 at %, about 0.8 at %, or about 1 at % to about 1.2 at %, about 1.5 at %, about 1.8 at %, about 2 at %, about 2.5 at %, about 3 at %, about 3.5 at %, about 4 at %, about 4.5 at %, or about 5 at % within the nanolaminate film stack 230 or the coalesced film 240 containing aluminum oxide (or other base material). For example, the protective coating 200 or 250 has a concentration of hafnium (or other doping material) of about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.01 at % to about 0.05 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 0.5 at % to about 5 at %, about 0.5 at % to about 4 at %, about 0.5 at % to about 3 at %, about 0.5 at % to about 2.5 at %, about 0.5 at % to about 2 at %, about 0.5 at % to about 1.5 at %, about 0.5 at % to about 1 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the nanolaminate film stack 230 or the coalesced film 240 containing aluminum oxide (or other base material).

Figure 3B:
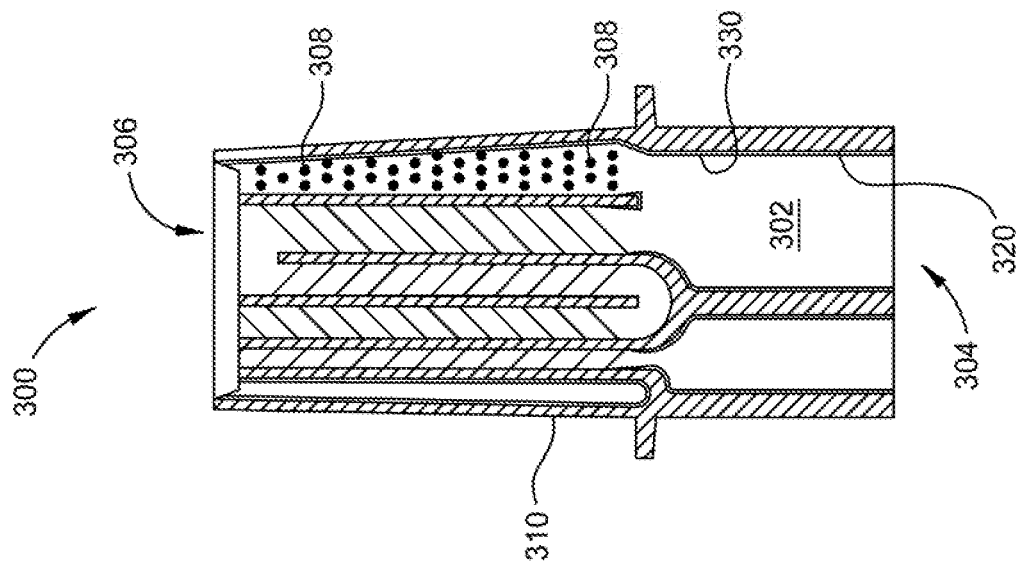
FIGS. 3A and 3B are schematic views of an aerospace component containing one or more protective coatings, according to one or more embodiments described and discussed herein.
Figure 3A:
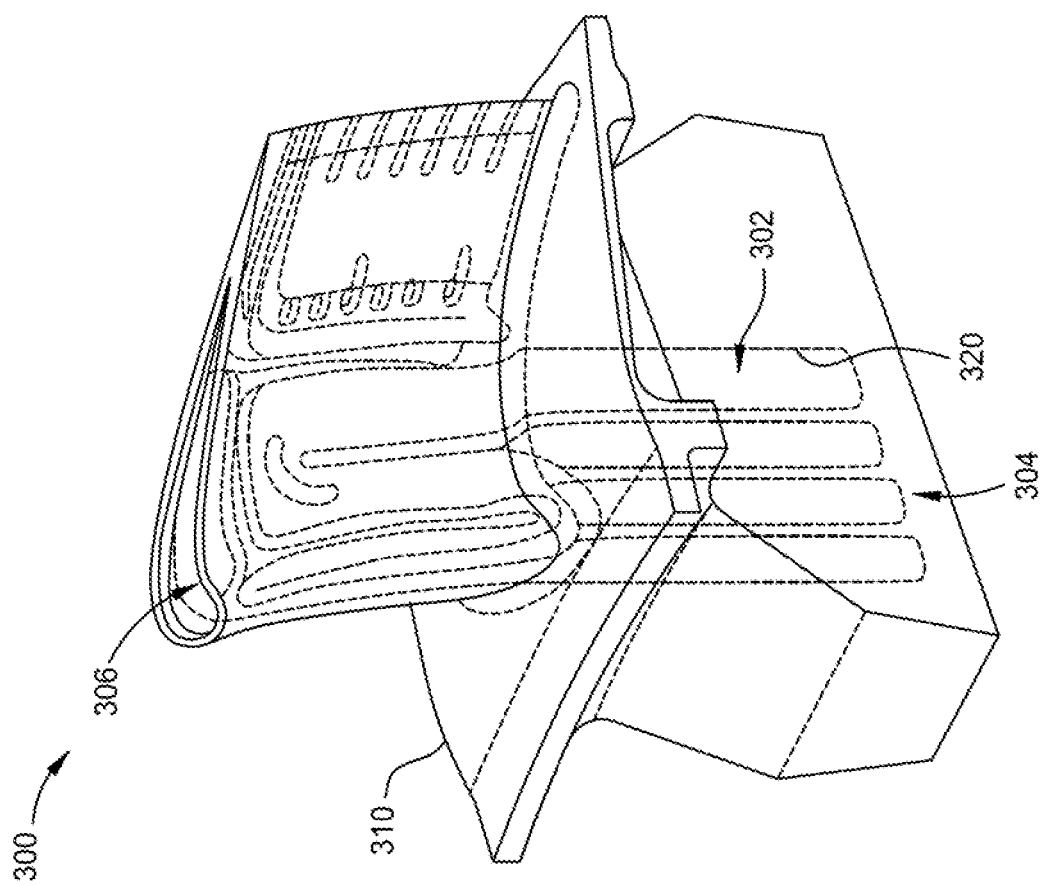

FIGS. 3A and 3B are schematic views of an aerospace component 300 containing a protective coating 330, according to one or more embodiments described and discussed herein. FIG. 3A is a perspective view of the aerospace component 300 and FIG. 3B is a cross-sectional view of the aerospace component 300. The protective coating 330 can be or include one or more nanolaminate film stacks, one or more coalesced films, or any combination thereof, as described and discussed herein. For example, the protective coating 330 can be or include the protective coating 200 containing the nanolaminate film stack 230 (FIG. 2A) and/or can be or include the protective coating 250 containing the coalesced film 240 (FIG. 2B). Similarly, the aerospace component 300 can be or include the aerospace component 202 (FIGS. 2A-2B). Aerospace components as described and discussed herein, including aerospace component 300, can be or include one or more components or portions thereof of a turbine, an aircraft, a spacecraft, or other devices that can include one or more turbines (e.g., compressors, pumps, turbo fans, super chargers, and the like). Exemplary aerospace components 300 can be or include a turbine blade, a turbine vane, a support member, a frame, a rib, a fin, a pin fin, a combustor fuel nozzle, a combustor shield, an internal cooling channel, or any combination thereof.

The aerospace component 300 has one or more outer or exterior surfaces 310 and one or more inner or interior surfaces 320. The interior surfaces 320 can define one or more cavities 302 extending or contained within the aerospace component 300. The cavities 302 can be channels, passages, spaces, or the like disposed between the interior surfaces 320. The cavity 302 can have one or more openings 304, 306, and 308. Each of the cavities 302 within the aerospace component 300 typically have aspect ratios (e.g., length divided by width) of greater than 1. The methods described and discussed herein provide depositing and/or otherwise forming the protective coatings 200 and 250 on the interior surfaces 320 with high aspect ratios (greater than 1) and/or within the cavities 302.

The aspect ratio of the cavity 302 can be from about 2, about 3, about 5, about 8, about 10, or about 12 to about 15, about 20, about 25, about 30, about 40, about 50, about 65, about 80, about 100, about 120, about 150, about 200, about 250, about 300, about 500, about 800, about 1,000, or greater. For example, the aspect ratio of the cavity 302 can be from about 2 to about 1,000, about 2 to about 500, about 2 to about 200, about 2 to about 150, about 2 to about 120, about 2 to about 100, about 2 to about 80, about 2 to about 50, about 2 to about 40, about 2 to about 30, about 2 to about 20, about 2 to about 10, about 2 to about 8, about 5 to about 1,000, about 5 to about 500, about 5 to about 200, about 5 to about 150, about 5 to about 120, about 5 to about 100, about 5 to about 80, about 5 to about 50, about 5 to about 40, about 5 to about 30, about 5 to about 20, about 5 to about 10, about 5 to about 8, about 10 to about 1,000, about 10 to about 500, about 10 to about 200, about 10 to about 150, about 10 to about 120, about 10 to about 100, about 10 to about 80, about 10 to about 50, about 10 to about 40, about 10 to about 30, about 10 to about 20, about 20 to about 1,000, about 20 to about 500, about 20 to about 200, about 20 to about 150, about 20 to about 120, about 20 to about 100, about 20 to about 80, about 20 to about 50, about 20 to about 40, or about 20 to about 30.

The aerospace component 300 and any surface thereof including one or more outer or exterior surfaces 310 and/or one or more inner or interior surfaces 320 can be made of, contain, or otherwise include one or more metals, such as nickel, aluminum, chromium, iron, titanium, hafnium, one or more nickel superalloys, one or more Inconel alloys, one or more Hastelloy alloys, alloys thereof, or any combination thereof. The protective coating 330 can be deposited, formed, or otherwise produced on any surface of the aerospace component 300 including one or more outer or exterior surfaces 310 and/or one or more inner or interior surfaces 320.

The protective coating, as described and discussed herein, can be or include one or more of laminate film stacks, coalesced films, graded compositions, and/or monolithic films which are deposited or otherwise formed on any surface of an aerospace component. In some examples, the protective coating contains from about 1% to about 100% chromium oxide. The protective coatings are conformal and substantially coat rough surface features following surface topology, including in open pores, blind holes, and non-line-of sight regions of a surface. The protective coatings do not substantially increase surface roughness, and in some embodiments, the protective coatings may reduce surface roughness by conformally coating roughness until it coalesces. The protective coatings may contain particles from the deposition that are substantially larger than the roughness of the aerospace component, but are considered separate from the monolithic film. The protective coatings are substantially well adhered and pinhole free. The thickness of the protective coatings varies within 1-sigma of 40%. In one or more embodiments, the thickness varies less than 1-sigma of 20%, 10%, 5%, 1%, or 0.1%.

The protective coatings provide corrosion and oxidation protection when the aerospace components are exposed to air, oxygen, sulfur and/or sulfur compounds, acids, bases, salts (e.g., Na, K, Mg, Li, or Ca salts), or any combination thereof.

One or more embodiments described herein include methods for the preservation of an underneath chromium-containing alloy using the methods producing an alternating nanolaminate of first material (e.g., chromium oxide, aluminum oxide, and/or aluminum nitride) and another secondary material. The secondary material can be or include one or more of aluminum oxide, aluminum nitride, aluminum oxynitride, silicon oxide, silicon nitride, silicon carbide, yttrium oxide, yttrium nitride, yttrium silicon nitride, hafnium oxide, hafnium silicate, hafnium silicide, hafnium nitride, titanium oxide, titanium nitride, titanium silicide, titanium silicate, dopants thereof, alloys thereof, or any combination thereof. The resultant film can be used as a nanolaminate film stack or the film can be subjected to annealing where the high temperature coalesces the films into a single structure where the new crystalline assembly enhances the integrity and protective properties of this overlying film.

In a particular embodiment, the chromium precursor (at a temperature of about 0° C. to about 250° C.) is delivered to the aerospace component via vapor phase delivery for at pre-determined pulse length of 5 seconds. During this process, the deposition reactor is operated under a flow of nitrogen carrier gas (about 1,000 sccm total) with the chamber held at a pre-determined temperature of about 350° C. and pressure of about 3.5 Torr. After the pulse of the chromium precursor, the chamber is then subsequently pumped and purged of all requisite gases and byproducts for a determined amount of time. Subsequently, water is pulsed into the chamber for 0.1 seconds at chamber pressure of about 3.5 Torr. An additional chamber purge (or pump/purge) is then performed to rid the reactor of any excess reactants and reaction byproducts. This process is repeated as many times as necessary to get the target CrOx film to the desired film thickness.

For the secondary film (example: aluminum oxide), the precursor, trimethylaluminum (at a temperature of about 0° C. to about 30° C.) is delivered to the aerospace component via vapor phase delivery for at pre-determined pulse length of 0.1 seconds. During this process, the deposition reactor is operated under a flow of nitrogen carrier gas (100 sccm total) with the chamber held at a pre-determined temperature of about 150° C. to about 350° C. and pressure about 1 Torr to about 5 Torr. After the pulse of trimethylaluminum, the chamber is then subsequently pumped and purged of all requisite gases and byproducts for a determined amount of time. Subsequently, water vapor is pulsed into the chamber for about 0.1 seconds at chamber pressure of about 3.5 Torr. An additional chamber purge is then performed to rid the reactor of any excess reactants and reaction byproducts. This process is repeated as many times as necessary to get the target $Al_2O_3$ film to the desired film thickness. The aerospace component is then subjected to an annealing furnace at a temperature of about 500° C. under inert nitrogen flow of about 500 sccm for about one hour.

Doped/Alloyed ALD Layers Processes

One or more embodiments described herein include methods for the preservation of an underlying aerospace component by using a doped chromium-containing film. This film is or includes a chromium-containing film produced by using a chromium precursor, and one or more of oxygen sources or oxidizing agents (for chromium oxide deposition), nitrogen sources or nitriding agents (for chromium nitride deposition), one or more carbon sources or carbon precursors (for chromium carbide deposition), silicon sources or silicon precursors (for chromium silicide deposition), or any combination thereof. A doping precursor (or dopant) can be or include a source for aluminum, yttrium, hafnium, silicon, tantalum, zirconium, strontium, lanthanum, neodymium, holmium, barium, lutetium, dysprosium, samarium, terbium, erbium, thulium, titanium, niobium, manganese, scandium, europium, tin, cerium, or any combination thereof. The precursors used can be or include, but is not limited to, one or more chromium precursors, as described and discussed above. The chromium precursor can be used during a deposition process to produce doped film containing the ternary material (e.g., YCrO or CrAlO). The resultant film can be used as a nanolaminate film stack or the film can be subjected to annealing where the high temperature coalesces the films into a single structure where the new crystalline assembly enhances the integrity and protective properties of this overlying film.

In a particular embodiment, the chromium precursor, bis(1,4-ditertbutyldiazadienyl)chromium (II) (at a temperature of about 0° C. to about 250° C.) is delivered to the aerospace component via vapor phase delivery for at pre-determined pulse length of 5 seconds. During this process, the deposition reactor is operated under a flow of nitrogen carrier gas of about 1,000 sccm with the chamber held at a pre-determined temperature of about 350° C. and pressure of about 3.5 Torr. After the pulse of the chromium precursor, the chamber is then subsequently pumped and purged of all requisite gases and byproducts for a determined amount of time. Subsequently, a second reactant, water is pulsed into the chamber for 0.1 seconds at chamber pressure of about 3.5 Torr. A second chamber purge is then performed to rid the reactor of any excess reactants and reaction byproducts.

This chromium precursor/pump-purge/water/pump-purge sequence is repeated as many times as necessary to get the target CrOx film to the desired film thickness. This process results in the formation of a first CrOx laminate layer with desired thickness.

After the first CrOx laminate layer deposition, a third reactant, tetrakis(ethylmethylamino)hafnium (TEMAH) is pulsed into the chamber for 5 seconds at chamber pressure of about 1.6 Torr. A final chamber pump/purge is then performed to rid the reactor of any excess reactants and reaction byproducts. Subsequently, a second reactant, water is pulsed into the chamber for 3 seconds at chamber pressure of about 1.2 Torr. A second chamber pump/purge is then performed to rid the reactor of any excess reactants and reaction byproducts. This single sequence results in the formation of a second HfOx laminate layer with monolayer (HfOx) thickness.

This first CrOx/second HfOx laminate layer sequence is repeated as many times as necessary to get the target Hf-doped chromium oxide film (CrOx:Hf) to the desired film thickness. The resultant CrOx:Hf film can be used as a nanolaminate film stack or the film can be subjected to annealing where the high temperature activates Hf diffusion into a CrOx layers where the more uniform Hf distribution in CrOx:Hf film enhances the integrity and protective properties of this overlying film.

In a particular embodiment, the selected Al precursor, trimethylaluminum (TMAl) (at a temperature of about 0° C. to about 30° C.) is delivered to the aerospace component via vapor phase delivery for at pre-determined pulse length of about 0.1 seconds to about 1 second. During this process, the deposition reactor is operated under a flow of nitrogen carrier gas of about 100 sccm with the chamber held at a pre-determined temperature of about 150° C. to about 350° C. and pressure of about 1 Torr to about 5 Torr. After the pulse of trimethylaluminum, the chamber is then subsequently pumped and purged of all requisite gases and byproducts for a determined amount of time. Subsequently, water vapor is pulsed into the chamber for 3 seconds at chamber pressure of about 1 Torr to about 5 Torr. An additional chamber purge is then performed to rid the reactor of any excess reactants and reaction byproducts. The aluminum precursor/pump-purge/water/pump-purge sequence is repeated as many times as necessary to get the target AlOx (e.g., $Al_2O_3$) film to the desired film thickness. This process results in the formation of a first AlOx laminate layer with desired thickness.

After first AlOx laminate layer deposition, a third reactant, tetrakis(ethylmethylamino)hafnium (TEMAH) is pulsed into the chamber for about 5 seconds at chamber pressure of about 1.6 Torr. A final chamber pump/purge is then performed to rid the reactor of any excess reactants and reaction byproducts. Subsequently, a second reactant, water is pulsed into the chamber for about 3 seconds at chamber pressure of about 1.2 Torr. A second chamber pump/purge is then performed to rid the reactor of any excess reactants and reaction byproducts. This single sequence results in the formation of a second HfOx laminate layer with monolayer (HfOx) thickness.

This first AlOx/second HfOx laminate layer sequence is repeated as many times as necessary to get the target Hf-doped aluminum oxide film (AlOx:Hf) to the desired film thickness. In some examples, the resultant AlOx:Hf film is used as a nanolaminate film stack. In other examples, the resultant AlOx:Hf film is subjected to annealing where the high temperature activates Hf diffusion into a AlOx layers where the more uniform Hf distribution in AlOx:Hf film enhances the integrity and protective properties of this overlying film.

SEM shows cross-sections of ALD as-grown Hf doped $Al_2O_3$ layers on Si aerospace component. SEM shows cross-section of Hf doped $Al_2O_3$ layer with about 0.1 at % Hf concentration. The total $Al_2O_3$:Hf film thickness is about 140 nm. The film contains six $Al_2O_3/HfO_2$ laminate layers. The single $Al_2O_3/HfO_2$ laminate layer thickness is about 23 nm. SEM shows cross-section of Hf doped $Al_2O_3$ layer with about 0.5 at % Hf concentration. The total $Al_2O_3$:Hf film thickness is about 108 nm. The film contains twenty one $Al_2O_3/HfO_2$ laminate layers. The single $Al_2O_3/HfO_2$ laminate layer thickness is about 5.1 nm.

The visual differentiation of $HfO_2$ and $Al_2O_3$ layers on SEM cross section is clear seen for about 0.1 at % Hf doped sample. However SEM resolution (10 nm) limits the visual differentiation of $HfO_2$ and $Al_2O_3$ layers for about 0.5 at % Hf doped sample. SIMS is used to determine concentration depth profiles of ALD as-grown Hf doped $Al_2O_3$ layers on the aerospace component. A SIMS concentration depth profile of Hf doped $Al_2O_3$ layer is about 0.1 at % Hf concentration. The film contains six $Al_2O_3/HfO_2$ laminate layers. A SIMS concentration depth profile of Hf doped $Al_2O_3$ layer is about 0.5 at % Hf concentration. The film contains of twenty one $Al_2O_3/HfO_2$ laminate layers.

Rutherford backscattering spectrometry (RBS) provides compositional analysis data for ALD as-grown Hf doped $Al_2O_3$ layers. The RBS analysis proved what bulk $Al_2O_3$:Hf layer with six $Al_2O_3/HfO_2$ laminate layers has about 0.1 at % Hf concentration, and bulk $Al_2O_3$:Hf layer with twenty one $Al_2O_3/HfO_2$ laminate layers has about 0.5 at % Hf concentration.

In one or more embodiments, the protective coatings which include chromium chromium-containing materials are desirable for a number of applications where a stable chromium oxide forms in air to protect the surface from oxidation, acid attack, and sulfur corrosion. In the instance of Fe, Co, and/or Ni-based alloys, chromium oxides (as well as aluminum oxides) are formed selectively to create a passivated surface. However, prior to forming this selective oxide layer, other metallic elements will oxidize until the chromium oxide forms a continuous layer.

After the formation of a dense chromium oxide layer, exposure to high temperatures (e.g., greater than 500° C.) in air causes thickening of the chromium oxide scale, where chromium diffuses out of the bulk metal and into the scale, and oxygen diffuses from the air into the scale. Over time, the scale growth rate slows as the scale thickens because (1) oxygen diffusion is slower and (2) chromium becomes depleted in the bulk alloy. For alloys, if the chromium concentration falls below a threshold, other oxides may begin to form which cause the spallation or failure of the previously protective scale.

To extend the life of a chromium-containing alloy, one or more of the following methods can be used. In one or more embodiments, the method can include depositing an oxide layer matching the composition and crystal structure of the native oxide to produce the protective coating. In other embodiments, the method can include depositing an oxide layer with a different crystal structure to the native oxide to produce the protective coating. In some embodiments, the method can include depositing an oxide layer with additional dopants that would not be present in the native oxide to produce the protective coating. In other embodiments, the method can include depositing another oxide (e.g., silicon oxide or aluminum oxide) as a capping layer or in a multi-layer stack to produce the protective coating.

In one or more embodiments of the method, a non-native oxide may be initially deposited onto the surface of the metal surface of aerospace component or other substrate that effectively thickens the oxide, thereby slowing oxygen diffusion toward the metal surface and resulting in slower absolute thicknesses growth of the oxide film. In some examples, a benefit of this approach can be contemplated in the context of a parabolic oxide scale growth curve. At thicker scales (e.g., greater than 0.5 micron to about 1.5 micron), the rate of scale thickness decreases versus initial growth. By depositing an oxide film having a thickness of about 100 nm, about 200 nm, or about 300 nm to about 1 micron, about 2 micron, or about 3 micron prior to the growth of a thick scale. The effective growth rate of the first thickness of about 0.5 micron to about 1 micron of native scale can be much slower over a given period of time. In turn, the rate of depletion of chromium from the substrate can be slower, and the time a surface can be exposed to the environment can be longer.

Oxygen diffusion can further be slowed by depositing a predetermined crystalline structure of chromium oxide, e.g., amorphous. Oxygen can diffuse along grain boundaries faster than in bulk crystals for chromium oxide, so minimizing grain boundaries can be beneficial for slowing oxygen diffusion. In turn, scale growth can be slower, and the time a surface can be exposed to the environment can be longer.

In other embodiments, the method can include incorporating one or more dopants into the deposited oxide while producing the protective coating. The dopant can be or include a source for aluminum, yttrium, hafnium, silicon, tantalum, zirconium, strontium, lanthanum, neodymium, holmium, barium, lutetium, dysprosium, samarium, terbium, erbium, thulium, titanium, niobium, manganese, scandium, europium, tin, cerium, or any combination thereof. The dopant can segregate to grain boundaries and modify grain boundary diffusion rates to slow the rate of oxide scale growth.

In one or more embodiments, an aerospace component includes a coating disposed on a surface of a substrate. The surface or substrate includes or contains nickel, nickel superalloy, aluminum, chromium, iron, titanium, hafnium, alloys thereof, or any combination thereof. The coating has a thickness of less than 10 μm and contains an aluminum oxide layer. In some examples, the surface of the aerospace component is an interior surface within a cavity of the aerospace component. The cavity can have an aspect ratio of about 5 to about 1,000 and the coating can have a uniformity of less than 30% of the thickness across the interior surface.

Embodiments of the present disclosure further relate to any one or more of the following paragraphs:

1. A method for depositing a coating on an aerospace component, comprising: sequentially exposing the aerospace component to a chromium precursor and a reactant to form a chromium-containing layer on a surface of the aerospace component by an atomic layer deposition process.

2. A method for depositing a coating on an aerospace component, comprising: forming a nanolaminate film stack on a surface of the aerospace component, wherein the nanolaminate film stack comprises alternating layers of a chromium-containing layer and a second deposited layer; sequentially exposing the aerospace component to a chromium precursor and a first reactant to form the chromium-containing layer on the surface by atomic layer deposition, wherein the chromium-containing layer comprises chromium oxide, chromium nitride, or a combination thereof; and sequentially exposing the aerospace component to a metal or silicon precursor and a second reactant to form the second deposited layer on the surface by atomic layer deposition, wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof.

3. The method of paragraph 1 or 2, wherein the chromium precursor comprises bis(cyclopentadiene) chromium, bis (pentamethylcyclopentadiene) chromium, bis(isopropylcyclopentadiene) chromium, bis(ethylbenzene) chromium, chromium hexacarbonyl, chromium acetylacetonate, chromium hexafluoroacetylacetonate, a chromium diazadienyl, isomers thereof, complexes thereof, abducts thereof, salts thereof, or any combination thereof.

4. The method of paragraph 3, wherein the chromium diazadienyl has a chemical formula of:

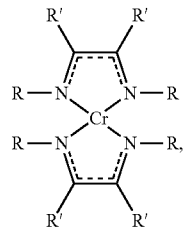

wherein each R and R' is independently selected from H, C1-C6 alkyl, aryl, acyl, alkylamido, hydrazido, silyl, aldehyde, keto, C2-C4 alkenyl, alkynyl, or substitutes thereof.

5. The method of paragraph 4, wherein each R is independently C1-C6 alkyl which is selected from methyl, ethyl, propyl, butyl, or isomers thereof, and R' is H.

6. The method of paragraph 4, wherein R is tert-butyl and R' is H.

7. The method of paragraph 4, wherein the chromium diazadienyl is chromium(II) bis(1,4-ditertbutyldiazadienyl).

8. The method according to any one of paragraphs 1-7, wherein the reactant comprises a reducing agent and the chromium-containing layer comprises metallic chromium.

9. The method of paragraph 8, wherein the reducing agent comprises hydrogen ($H_2$), ammonia, hydrazine, a hydrazine, an alcohol, a cyclohexadiene, a dihydropyrazine, an aluminum containing compound, abducts thereof, salts thereof, plasma derivatives thereof, or any combination thereof.

10. The method according to any one of paragraphs 1-9, wherein the reactant comprises an oxidizing agent and the chromium-containing layer comprises chromium oxide.

11. The method of paragraph 10, wherein the oxidizing agent comprises water, oxygen ($O_2$), atomic oxygen, ozone, nitrous oxide, a peroxide, an alcohol, plasmas thereof, or any combination thereof.

12. The method according to any one of paragraphs 1-11, wherein the reactant comprises a nitriding agent and the chromium-containing layer comprises chromium nitride.

13. The method of paragraph 12, wherein the nitriding agent comprises ammonia, atomic nitrogen, a hydrazine, plasmas thereof, or any combination thereof.

14. The method according to any one of paragraphs 1-13, wherein the reactant comprises a carbon precursor or a silicon precursor and the chromium-containing layer comprises chromium carbide or chromium silicide.

15. The method of paragraph 14, wherein the carbon precursor comprises an alkane, an alkene, an alkyne, substitutes thereof, plasmas thereof, or any combination thereof, and the silicon precursor comprises silane, disilane, substituted silanes, plasmas thereof, or any combination thereof.

16. The method according to any one of paragraphs 1-15, further comprising forming a nanolaminate film stack on the surface of the aerospace component, wherein the nanolaminate film stack comprises alternating layers of the chromium-containing layer and a second deposited layer.

17. The method of paragraph 16, wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof.

18. The method of paragraph 16, wherein the chromium-containing layer comprises chromium oxide, chromium nitride, or a combination thereof, and wherein the second deposited layer comprises aluminum oxide, silicon nitride, hafnium oxide, hafnium silicate, or any combination thereof.

19. The method of paragraph 16, wherein the alternating layers in the nanolaminate film stack comprises from 1 pair to about 50 pairs of the chromium-containing layer and the second deposited layers.

20. The method of paragraph 16, wherein the second deposited layer is deposited by atomic layer deposition.

21. The method of paragraph 16, further comprising annealing the aerospace component and converting the nanolaminate film stack into a coalesced film.

22. The method according to any one of paragraphs 1-21, wherein the aerospace component is a turbine blade, a turbine vane, a support member, a frame, a rib, a fin, a pin fin, a combustor fuel nozzle, a combustor shield, an internal cooling channel, or any combination thereof.

23. The method according to any one of paragraphs 1-22, wherein the surface of the aerospace component is an interior surface of the aerospace component.

24. The method according to any one of paragraphs 1-23, wherein the surface of the aerospace component is an exterior surface of the aerospace component.

25. The method according to any one of paragraphs 1-24, wherein the surface of the aerospace component comprises nickel, nickel superalloy, aluminum, chromium, iron, titanium, hafnium, alloys thereof, or any combination thereof.

26. An aerospace component, comprising: a surface comprising nickel, nickel superalloy, aluminum, chromium, iron, titanium, hafnium, alloys thereof, or any combination thereof; and a coating having a thickness of less than 10 μm and disposed on the surface, wherein the coating comprises a chromium-containing layer, and wherein the chromium-containing layer comprises metallic chromium, chromium oxide, chromium nitride, chromium carbide, chromium silicide, or any combination thereof.

27. An aerospace component, comprising: a surface comprising nickel, nickel superalloy, aluminum, chromium, iron, titanium, hafnium, alloys thereof, or any combination thereof; and a coating having a thickness of less than 10 μm and disposed on the surface, wherein the coating comprises aluminum oxide.

28. An aerospace component, comprising: a surface comprising nickel, nickel superalloy, aluminum, chromium, iron, titanium, hafnium, alloys thereof, or any combination thereof; and a coating on the surface, wherein the coating is deposited by atomic layer deposition and comprises a chromium-containing layer, and wherein the chromium-containing layer comprises metallic chromium, chromium oxide, chromium nitride, chromium carbide, chromium silicide, or any combination thereof.

29. The aerospace component according to any one of paragraphs 26-28, wherein the surface of the aerospace component is an interior surface within a cavity of the aerospace component, wherein the cavity has an aspect ratio of about 5 to about 1,000, and wherein the coating has a uniformity of less than 30% of the thickness across the interior surface.

30. The aerospace component according to any one of paragraphs 26-29, wherein the aerospace component is a turbine blade, a turbine vane, a support member, a frame, a rib, a fin, a pin fin, a combustor fuel nozzle, a combustor shield, an internal cooling channel, or any combination thereof.

31. The aerospace component according to any one of paragraphs 26-30, wherein the surface has a cavity with an aspect ratio of greater than 5 to 1,000.

32. A method for depositing a coating on an aerospace component, comprising: exposing an aerospace component to a first precursor and a first reactant to form a first deposited layer on a surface of the aerospace component by a chemical vapor deposition (CVD) process or a first atomic layer deposition (ALD) process; and exposing the aerospace component to a second precursor and a second reactant to form a second deposited layer on the first deposited layer by a second ALD process, wherein the first deposited layer and the second deposited layer have different compositions from each other.

33. A method for depositing a coating on an aerospace component, comprising: forming a nanolaminate film stack on a surface of the aerospace component, wherein the nanolaminate film stack comprises alternating layers of a first deposited layer and a second deposited layer; sequentially exposing the aerospace component to a first precursor and a first reactant to form the first deposited layer on the surface by atomic layer deposition, wherein the first deposited layer comprises chromium oxide, chromium nitride, aluminum oxide, aluminum nitride, or any combination thereof; and sequentially exposing the aerospace component to a second precursor and a second reactant to form the second deposited layer on the first deposited layer by atomic layer deposition, wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof, and wherein the first deposited layer and the second deposited layer have different compositions from each other.

34. The method of paragraph 32 or 33, wherein the first deposited layer is formed by the first ALD process and the method further comprises sequentially exposing the aerospace component to the first precursor and the first reactant to form the first deposited layer.

35. The method of paragraph 34, wherein each cycle of the first ALD process comprises exposing the aerospace component to the first precursor, conducting a pump-purge, exposing the aerospace component to the first reactant, and conducting the pump-purge, and each cycle is repeated from 2 times to about 500 times to form the first deposited layer prior to forming the second deposited layer.

36. The method according to any one of paragraphs 32-35, wherein the first deposited layer is formed by the CVD process and the method further comprises simultaneously exposing the aerospace component to the first precursor and the first reactant to form the first deposited layer.

37. The method according to any one of paragraphs 32-36, wherein the first deposited layer comprises chromium oxide, chromium nitride, aluminum oxide, or aluminum nitride, wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, titanium oxide, titanium nitride, titanium silicide, titanium silicate, or any combination thereof, and wherein if the first deposited layer comprises aluminum oxide or aluminum nitride, then the second deposited layer does not comprises aluminum oxide or aluminum nitride.

38. The method according to any one of paragraphs 32-37, wherein the first precursor comprises a chromium precursor or an aluminum precursor, and the first reactant comprises an oxidizing agent, a nitriding agent, or a combination thereof.

39. The method according to any one of paragraphs 32-38, wherein the second precursor comprises an aluminum precursor or a hafnium precursor, and the second reactant comprises an oxidizing agent, a nitriding agent, or a combination thereof.

40. The method according to any one of paragraphs 32-39, wherein the first precursor comprises bis(cyclopentadiene) chromium, bis(pentamethylcyclopentadiene) chromium, bis (isopropylcyclopentadiene) chromium, bis(ethylbenzene) chromium, chromium hexacarbonyl, chromium acetylacetonate, chromium hexafluoroacetylacetonate, a chromium diazadienyl, isomers thereof, complexes thereof, abducts thereof, salts thereof, or any combination thereof.

41. The method of paragraph 40, wherein the chromium diazadienyl has a chemical formula of:

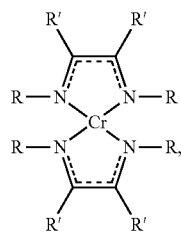

wherein each R and R' is independently selected from H, C1-C6 alkyl, aryl, acyl, alkylamido, hydrazido, silyl, aldehyde, keto, C2-C4 alkenyl, alkynyl, or substitutes thereof.

42. The method of paragraph 40, wherein each R is independently C1-C6 alkyl which is selected from methyl, ethyl, propyl, butyl, or isomers thereof, and R' is H.

43. The method of paragraph 40, wherein R is tert-butyl and R' is H.

44. The method of paragraph 40, wherein the chromium diazadienyl is chromium(II) bis(1,4-ditertbutyldiazadienyl).

45. The method according to any one of paragraphs 32-44, wherein the first precursor or the second precursor comprises an aluminum precursor, and wherein the aluminum precursor comprises a tris(alkyl) aluminum, a tris(alkoxy) aluminum, aluminum diketonates, complexes thereof, abducts thereof, salts thereof, or any combination thereof.

46. The method of paragraph 45, wherein the aluminum precursor comprises trimethylaluminum, triethylaluminum, tripropylaluminum, tributylaluminum, trimethoxyaluminum, triethoxyaluminum, tripropoxyaluminum, tributoxyaluminum, aluminum acetylacetonate, aluminum hexafluoroacetylacetonate, trisdipivaloylmethanatoaluminum, isomers thereof, complexes thereof, abducts thereof, salts thereof, or any combination thereof.

47. The method according to any one of paragraphs 32-46, wherein the first precursor or the second precursor comprises a hafnium precursor, and wherein the hafnium precursor comprises bis(methylcyclopentadiene) dimethylhafnium, bis(methylcyclopentadiene) methylmethoxyhafnium, bis(cyclopentadiene) dimethylhafnium, tetra(tert-butoxy) hafnium, hafnium isopropoxide, tetrakis(dimethylamino) hafnium (TDMAH), tetrakis(diethylamino) hafnium (TDEAH), tetrakis(ethylmethylamino) hafnium (TEMAH), isomers thereof, complexes thereof, abducts thereof, salts thereof, or any combination thereof.

48. The method according to any one of paragraphs 32-47, wherein a nanolaminate film stack comprises the first deposited layer and the second deposited layer, and the method further comprises depositing from 2 pairs to about 500 pairs of the first deposited layer and the second deposited layer while increasing a thickness of the nanolaminate film stack.

49. The method of paragraph 48, wherein each pair of the first deposited layer and the second deposited layer has a thickness of about 0.2 nm to about 50 nm.

50. The method of paragraph 48, further comprising annealing the aerospace component and converting the nanolaminate film stack into a coalesced film.

51. The method of paragraph 47, wherein the first deposited layer comprises aluminum oxide and the second deposited layer comprises hafnium oxide, and wherein a concentration of hafnium is about 0.01 at % to about 10 at % within the nanolaminate film stack.

52. The method of paragraph 48, wherein the nanolaminate film stack has a thickness of about 1 nm to about 5,000 nm.

53. The method according to any one of paragraphs 32-52, wherein the aerospace component is a turbine blade, a turbine vane, a support member, a frame, a rib, a fin, a pin fin, a combustor fuel nozzle, a combustor shield, an internal cooling channel, or any combination thereof.

54. The method according to any one of paragraphs 32-53, wherein the surface of the aerospace component is an interior surface of the aerospace component, and wherein the surface of the aerospace component comprises nickel, nickel superalloy, aluminum, chromium, iron, titanium, hafnium, alloys thereof, or any combination thereof.

55. The method according to any one of paragraphs 32-54, wherein the surface of the aerospace component has a cavity with an aspect ratio of greater than 5 to 1,000.

56. An aerospace component, comprising: a surface comprising nickel, nickel superalloy, aluminum, chromium, iron, titanium, hafnium, alloys thereof, or any combination thereof; and a coating disposed on the surface, wherein the coating comprises a nanolaminate film stack comprising alternating layers of a first deposited layer and a second deposited layer; wherein the first deposited layer comprises chromium oxide, chromium nitride, aluminum oxide, aluminum nitride, or any combination thereof; wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof; wherein the first deposited layer and the second deposited layer have different compositions from each other; and wherein the nanolaminate film stack has a thickness of about 1 nm to about 5,000 nm.

57. The aerospace component of paragraph 56, wherein the aerospace component is a turbine blade, a turbine vane, a support member, a frame, a rib, a fin, a pin fin, a combustor fuel nozzle, a combustor shield, an internal cooling channel, or any combination thereof.

58. The aerospace component of paragraph 56 or 57, wherein the surface of the aerospace component is an interior surface within a cavity of the aerospace component.

59. The aerospace component according to any one of paragraphs 56-58, wherein the cavity has an aspect ratio of about 5 to about 1,000.

60. The aerospace component according to any one of paragraphs 56-59, wherein the coating has a uniformity of less than 30% of the thickness across the interior surface.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. An aerospace component, comprising:
   a surface comprising nickel, nickel superalloy, aluminum, chromium, iron, titanium, hafnium, alloys thereof, or any combination thereof; and
   a coating disposed on the surface, wherein the coating comprises a nanolaminate film stack comprising two or more pairs of a first deposited layer and a second deposited layer;
   wherein the first deposited layer comprises chromium oxide, chromium nitride, aluminum oxide, aluminum nitride, or any combination thereof;
   wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof;
   wherein the first deposited layer and the second deposited layer have different compositions from each other; and
   wherein the nanolaminate film stack has a thickness of about 1 nm to about 5,000 nm.

2. The aerospace component of claim 1, wherein the coating is a coalesced film disposed on the surface, the coalesced film is formed by annealing the nanolaminate film stack.

3. The aerospace component of claim 1, wherein the nanolaminate film stack comprises from 3 pairs to about 1,000 pairs of the first deposited layer and the second deposited layer.

4. The aerospace component of claim 1, wherein the coating has a uniformity of less than 50% of the thickness of the coating.

5. The aerospace component of claim 4, wherein the coating has a uniformity of about 1% to about 30%.

6. The aerospace component of claim 1, wherein the surface of the aerospace component is an interior surface within a cavity of the aerospace component.

7. The aerospace component of claim 6, wherein the cavity has an aspect ratio of greater than 2.

8. The aerospace component of claim 7, wherein the cavity has an aspect ratio of greater than 5 to 1,000.

9. The aerospace component of claim 1, wherein the aerospace component is a turbine blade, a turbine vane, a support member, a frame, a rib, a fin, a pin fin, a combustor fuel nozzle, a combustor shield, an internal cooling channel, or any combination thereof.

10. The aerospace component of claim 9, wherein the aerospace component is a turbine blade.

11. The aerospace component of claim 1, wherein the surface of the aerospace component comprises nickel or a nickel superalloy.

12. The aerospace component of claim 1, wherein each of the first deposited layer and the second deposited layer independently has a thickness of about 0.1 nm to about 150 nm.

13. The aerospace component of claim 1, wherein the first deposited layer comprises aluminum oxide and the second deposited layer comprises hafnium oxide, and wherein a concentration of hafnium is about 0.01 at % to about 10 at % within the nanolaminate film stack.

14. The aerospace component of claim 1, wherein the nanolaminate film stack has a thickness of about 1 nm to about 5,000 nm.

15. An aerospace component, comprising:
    a surface comprising nickel or nickel superalloy; and
    a coating disposed on the surface, wherein the coating comprises a coalesced film formed by annealing a nanolaminate film stack which comprises two or more alternating layers of a first deposited layer and a second deposited layer;
    wherein the first deposited layer comprises chromium oxide, chromium nitride, aluminum oxide, aluminum nitride, or any combination thereof;
    wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof;
    wherein the first deposited layer and the second deposited layer have different compositions from each other; and
    wherein the nanolaminate film stack has a thickness of about 1 nm to about 5,000 nm.

16. The aerospace component of claim 15, wherein the nanolaminate film stack comprises from 3 pairs to about 1,000 pairs of the first deposited layer and the second deposited layer.

17. The aerospace component of claim 15, wherein the coating has a uniformity of less than 50% of the thickness of the coating.

18. The aerospace component of claim 15, wherein the surface of the aerospace component is an interior surface within a cavity of the aerospace component, and wherein the cavity has an aspect ratio of greater than 2.

19. The aerospace component of claim 18, wherein the cavity has an aspect ratio of greater than 5 to 1,000.

20. A turbine blade, comprising:
- a surface comprising nickel or nickel superalloy; and
- a coating disposed on the surface, wherein the coating comprises a coalesced film formed by annealing a nanolaminate film stack which comprises two or more alternating layers of a first deposited layer and a second deposited layer;
- wherein the first deposited layer comprises chromium oxide, chromium nitride, aluminum oxide, aluminum nitride, or any combination thereof;
- wherein the second deposited layer comprises aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof;
- wherein the first deposited layer and the second deposited layer have different compositions from each other; and
- wherein the nanolaminate film stack has a thickness of about 1 nm to about 5,000 nm.

\* \* \* \* \*